(12) United States Patent
Ha et al.

(10) Patent No.: US 10,916,534 B2
(45) Date of Patent: Feb. 9, 2021

(54) SEMICONDUCTOR DEVICE

(71) Applicant: Samsung Electronics Co., Ltd., Suwon-si (KR)

(72) Inventors: Seung Seok Ha, Hwaseong-si (KR); Kyoung-Mi Park, Yongin-si (KR); Hyun-Seung Song, Hwaseong-si (KR); Keon Yong Cheon, Yongin-si (KR); Dae Won Ha, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/395,691

(22) Filed: Apr. 26, 2019

(65) Prior Publication Data

US 2020/0027870 A1    Jan. 23, 2020

(30) Foreign Application Priority Data

Jul. 19, 2018   (KR) .......................... 10-2018-0084293

(51) Int. Cl.
| | |
|---|---|
| *H01L 27/02* | (2006.01) |
| *H01L 27/092* | (2006.01) |
| *H01L 21/8238* | (2006.01) |
| *H01L 29/06* | (2006.01) |

(52) U.S. Cl.
CPC .. *H01L 27/0207* (2013.01); *H01L 21/823821* (2013.01); *H01L 21/823878* (2013.01); *H01L 27/0924* (2013.01); *H01L 29/0649* (2013.01)

(58) Field of Classification Search
CPC ............. H01L 27/0924; H01L 27/0207; H01L 27/0886; H01L 21/823821; H01L 21/823864; H01L 21/823431; H01L 21/823487; H01L 29/785; H01L 29/78642
See application file for complete search history.

(56) References Cited

U.S. PATENT DOCUMENTS

| | | | |
|---|---|---|---|
| 9,406,676 B2 | 8/2016 | Yu et al. | |
| 9,412,616 B1 | 8/2016 | Xie et al. | |
| 10,038,079 B1* | 7/2018 | Ohtou | .................... H01L 21/845 |
| 2016/0155741 A1 | 6/2016 | Yoo et al. | |
| 2016/0276342 A1 | 9/2016 | Lim et al. | |
| 2017/0062420 A1 | 3/2017 | You et al. | |
| 2017/0338229 A1 | 11/2017 | Oh et al. | |
| 2018/0061942 A1 | 3/2018 | Doris et al. | |
| 2019/0368099 A1* | 12/2019 | Kim | ...................... D06F 23/025 |

\* cited by examiner

*Primary Examiner* — Hsien Ming Lee
(74) *Attorney, Agent, or Firm* — Muir Patent Law, PLLC

(57) ABSTRACT

A semiconductor device includes a first fin pattern and a second fin pattern in a NMOS region, each extending lengthwise along a first direction and separated by a first trench and a third fin pattern and a fourth fin pattern in a PMOS region, each extending lengthwise along the first direction in parallel with respective ones of the first fin pattern and the second fin pattern and separated by a second trench. First and second isolation layers are disposed in the first and second trenches, respectively. A first gate electrode extends lengthwise along a second direction transverse to the first direction and crosses the first fin pattern. A second gate electrode extends lengthwise along the second direction and crosses the second fin pattern. Spaced apart third and fourth gate electrodes extend lengthwise along the second direction on the second isolation layer.

20 Claims, 25 Drawing Sheets

SEMICONDUCTOR DEVICE

This application claims priority to Korean Patent Application No. 10-2018-0084293, filed on Jul. 19, 2018, and all the benefits accruing therefrom under 35 U.S.C. § 119, the disclosure of which is incorporated herein by reference in its entirety.

BACKGROUND

1. Technical Field

The present disclosure relates to a semiconductor device.

2. Description of the Related Art

One scaling technique for increasing density of a semiconductor device involves forming a multi-gate transistor including a multi-channel active pattern (or silicon body) having a fin or nanowire shape on a substrate and forming a gate on a surface of the multi-channel active pattern. Since such a multi-gate transistor utilizes three-dimensional channels, scaling can be performed relatively easily. In addition, even if the gate length of the multi-gate transistor is not increased, the current control capability may be improved. Additionally, it is also possible to effectively suppress a SCE (short channel effect) in which potential of a channel region is affected by a drain voltage.

SUMMARY

Aspects of the present disclosure provide a semiconductor device with enhanced degree of integration of an element, and improved reliability and performance.

According to some embodiments, a semiconductor device includes a substrate including a first fin pattern and a second fin pattern in a NMOS region of the substrate, each extending lengthwise along a first direction and separated by a first trench and a third fin pattern and a fourth fin pattern in a PMOS region of the substrate, each extending lengthwise along the first direction in parallel with respective ones of the first fin pattern and the second fin pattern and separated by a second trench. The semiconductor device also includes a first isolation layer in the first trench and a second isolation layer in the second trench. The semiconductor device further includes a first gate electrode extending lengthwise along a second direction transverse to the first direction and crossing the first fin pattern, a second gate electrode extending lengthwise along the second direction and crossing the second fin pattern, a third gate electrode extending lengthwise along the second direction on the second isolation layer, and a fourth gate electrode extending lengthwise along the second direction on the second isolation layer and spaced apart from the third gate electrode.

According to some embodiments, a semiconductor device includes a substrate including a first fin pattern and a second fin pattern in a NMOS region of the substrate, each extending lengthwise along a first direction and separated by a first trench having a first width and a third fin pattern and a fourth fin pattern in a PMOS region of the substrate, each extending lengthwise along the first direction in parallel with respective ones of the first fin pattern and the second fin pattern and separated by a second trench having a second width greater than the first width. The semiconductor device also includes a first gate electrode crossing the first fin pattern and a second gate electrode crossing the second fin pattern and spaced apart from the first gate electrode by a first distance greater than or equal to the first width. The device further includes a third gate electrode and a fourth gate electrode between the third fin pattern and the fourth fin pattern.

According to further embodiments, a semiconductor device includes a substrate including a first fin pattern and a second fin pattern in a NMOS region of the substrate, each extending lengthwise along a first direction and separated by a first trench and a third fin pattern and a fourth fin pattern in a PMOS region of the substrate, each extending lengthwise along the first direction in parallel with respective ones of the first fin pattern and the second fin pattern and separated by a second trench. The semiconductor device also includes a first isolation layer in the first trench and a second isolation layer in the second trench. The semiconductor device further includes a first gate electrode extending lengthwise along a second direction transverse to the first direction and crossing the first fin pattern and a second gate electrode extending lengthwise along the second direction and crossing the second fin pattern. The first gate electrode and the second gate electrode are disposed between the third fin pattern and the fourth fin pattern and do not overlap the first trench.

According to still further embodiments, a semiconductor device includes a substrate including first and second regions including transistors of the same conductivity type. The semiconductor device includes a first fin pattern and a second fin pattern in the first region, each extending lengthwise along a first direction and separated by a first trench, and a third fin pattern and a fourth fin pattern in the second region, each extending lengthwise along a second direction and separated by second trench. The semiconductor device further includes a first gate electrode overlapping first area of an upper surface of the first fin pattern at an end of the first fin pattern adjacent to the first trench and a second gate electrode overlapping a second area of an upper surface of the third fin pattern at an end of the third fin pattern adjacent to the second trench, wherein the second area is greater than the first area.

The aspects of the present disclosure are not restricted to those mentioned above and another aspect which is not mentioned may be clearly understood by those skilled in the art from the description below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Figure 1:
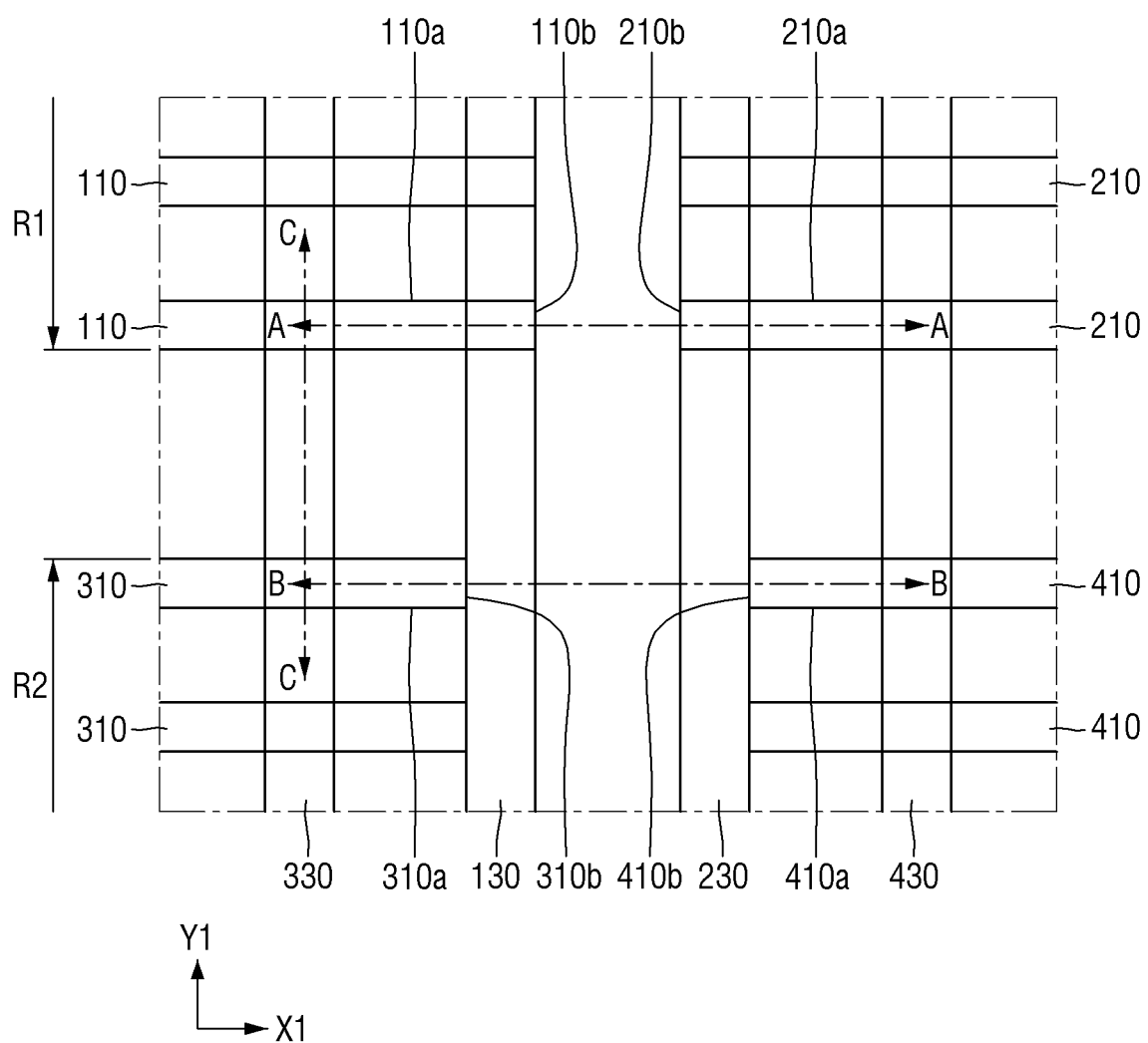
FIG. 1 is a schematic layout diagram illustrating a semiconductor device according to some embodiments of the present disclosure.

In the drawings of the semiconductor device according to some embodiments of the present disclosure, a fin type transistor (FinFET) including a channel region of a fin pattern shape is exemplarily illustrated, but the present disclosure is not limited thereto. A semiconductor device according to some embodiments of the present disclosure may include a tunneling FET, a transistor including a nanowire, a transistor including a nano-sheet, or a three-dimensional (3D) transistor. A semiconductor device according to some embodiments of the present disclosure may include a bipolar junction transistor, a lateral double diffused transistor (LDMOS), or the like.

Figure 2:
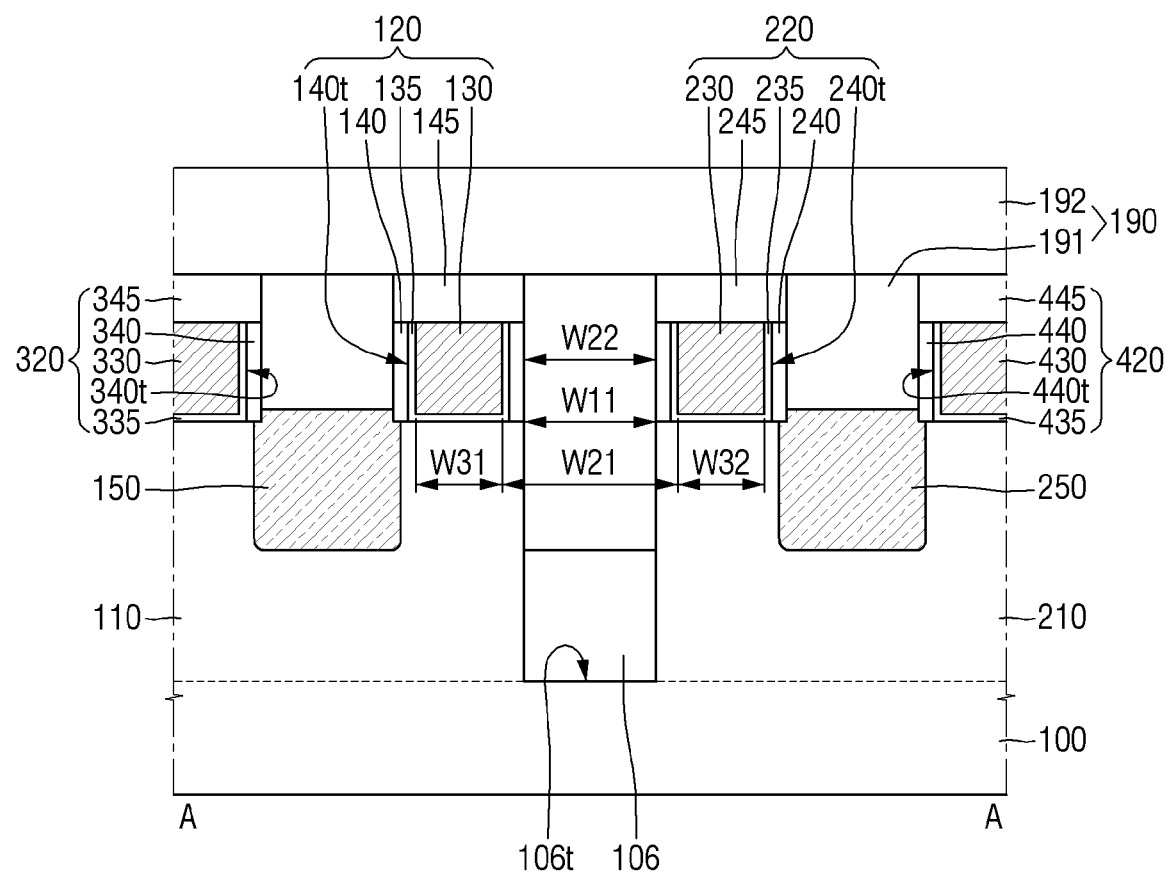
FIG. 2 is a cross-sectional view taken along line A-A of FIG. 1.
Figure 3:
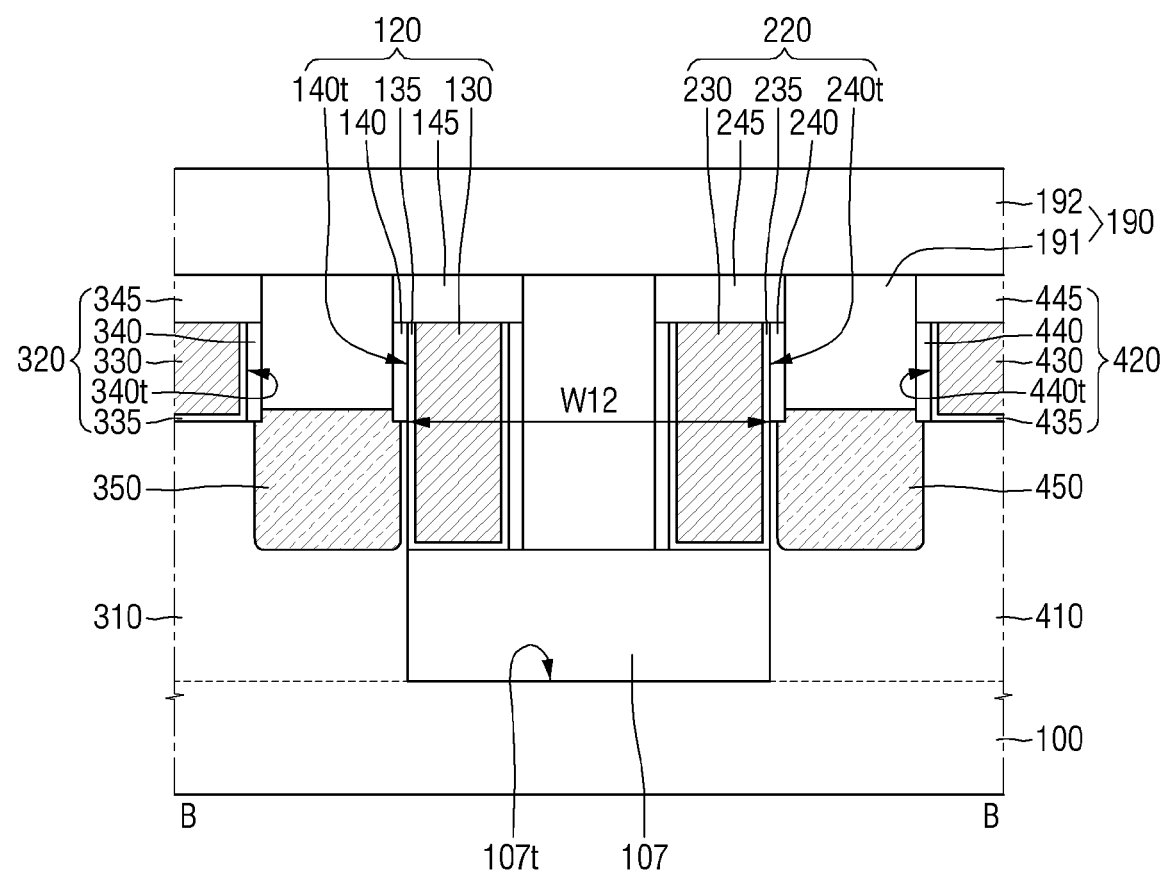
FIG. 3 is a cross-sectional view taken along line B-B of FIG. 1.
Figure 4:
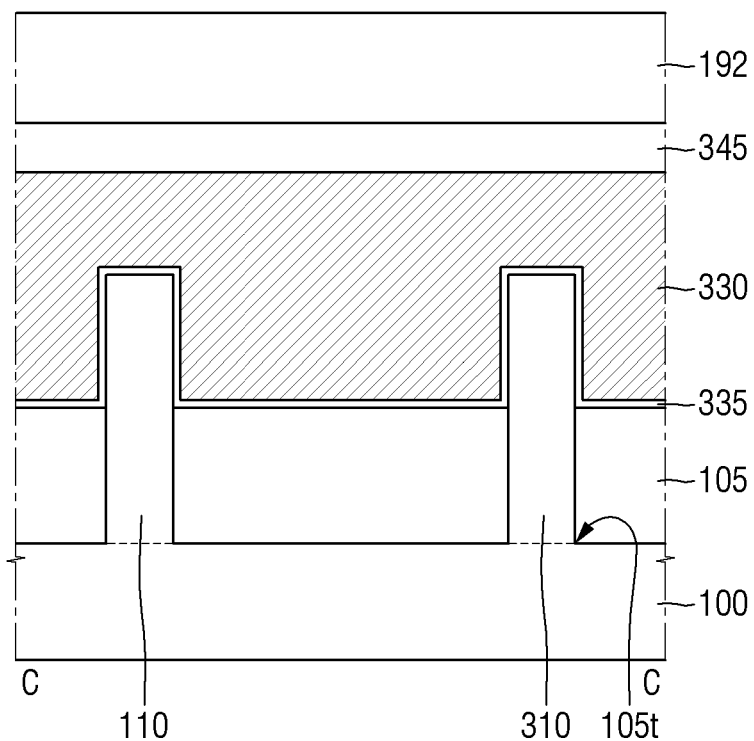
FIG. 4 is a cross-sectional view taken along line C-C of FIG. 1.

FIG. 1 is a schematic layout diagram illustrating a semiconductor device according to some embodiments of the present disclosure. FIG. 2 is a cross-sectional view taken along line A-A of FIG. 1. FIG. 3 is a cross-sectional view taken along line B-B of FIG. 1. FIG. 4 is a cross-sectional view taken along line C-C of FIG. 1.

Referring to FIG. 1 to FIG. 4, a semiconductor device according to some embodiments of the present disclosure includes first to fourth fin patterns 110, 210, 310 and 410, first to fourth gate structures 120, 220, 320 and 420, a first field insulating layer 105, a second field insulating layer 106, and a third field insulating layer 107. In some embodiments, the substrate 100 may be bulk silicon or silicon-on-insulator (SOI). In some embodiments, the substrate 100 may be a silicon substrate or may include other material, for example, silicon germanium, silicon germanium on insulator (SGOI), indium antimonide, lead tellurium compound, indium arsenide, phosphide indium, gallium arsenide or gallium antimonide, but the present disclosure is not limited thereto.

The substrate 100 may include a first region R1 and a second region R2. For example, the first region R1 may be a NMOS region and the second region R2 may be a PMOS region. The first region R1 and the second region R2 may be regions adjacent to each other or may be regions separated from each other.

As an example, the first region R1 and the second region R2 may be adjacent to each other and may share the same gate structures 120, 220, 320 and 420. As another example, the first region R1 and the second region R2 may be separated from each other and may not share the same gate structure. In FIG. 1, a region between the first region R1 and the second region R2 may be a field region disposed between the first region R1 and the second region R2.

Each of the first to fourth fin patterns 110, 210, 310 and 410 may protrude from the substrate 100. Each of the first to fourth fin patterns 110, 210, 310 and 410 may extend lengthwise on the substrate 100 along a first direction X1.

For example, the first to fourth fin patterns 110, 210, 310 and 410 may having lengths extending in the first direction X1, and widths extending in a second direction Y1. Each of the first to fourth fin patterns 110, 210, 310 and 410 may be defined by a fin trench 105t. For example, each of the longer sides 110a, 210a, 310a and 410a of the first to fourth fin patterns may be defined by the fin trench 105t.

The first fin pattern 110 and the second fin pattern 210 may be disposed in the first region R1 of the substrate 100. The first fin pattern 110 and the second fin pattern 210 may be used as channel regions of NMOS transistors.

The first and second fin patterns 110 and 210 may be aligned in the first direction X1 (longitudinal direction). The first fin pattern 110 may be spaced apart from the second fin pattern 210 in the first direction X1.

The shorter side 110b of the first fin pattern and the shorter side 210b of the second fin pattern may face each other. The first fin pattern 110 and the second fin pattern 210 may be separated from each other by a first fin-cut trench 106t. The shorter side 110b of the first fin pattern and the shorter side 210b of the second fin pattern may be defined by the first fin-cut trench 106t.

The third fin pattern 310 and the fourth fin pattern 410 may be disposed in the second region R2 of the substrate 100. The third fin pattern 310 and the fourth fin pattern 410 may be used as channel regions of respective PMOS transistors.

The third and fourth fin patterns 310 and 410 may be aligned in the first direction X1. The third fin pattern 310 may be spaced apart from the fourth fin pattern 410 in the first direction X1.

The shorter side 310b of the third fin pattern and the shorter side 410b of the fourth fin pattern may face each other. The third fin pattern 310 and the fourth fin pattern 410 may be separated from each other by a second fin-cut trench 107t. The side 310b of the third fin pattern and the side 410b of the fourth fin pattern may be defined by the second fin-cut trench 107t.

For example, a width W11 of the first fin-cut trench 106t in the first direction X1 is less than a width W12 of the second fin-cut trench 107t in the first direction X1. The width W11 of the first fin-cut trench 106t in the first direction X1 and the width W12 of the second fin-cut trench 107t in the first direction X1 may be widths at upper surfaces of the first to fourth fin patterns 110, 210, 310 and 410.

The third and fourth fin patterns 310 and 410 may be spaced apart from the first fin pattern 110 in the second direction Y1. A longer side 310a of the third fin pattern may face the longer side 110a of the first fin pattern, and a longer side 410a of the fourth fin pattern may face the longer side 210a of the second fin pattern. Although a plurality of the first to fourth fin patterns 110, 210, 310 and 410 is illustrated, respectively, the present disclosure is not limited thereto.

The first to fourth fin patterns 110, 210, 310 and 410 may be a part of the substrate 100 and may include an epitaxial layer grown on the substrate 100. Each of the first to fourth fin patterns 110, 210, 310 and 410 may include silicon and germanium, which are elemental semiconductor materials. In addition, the first to fourth fin patterns 110, 210, 310 and 410 may include compound semiconductors, such as, for example, a group IV-IV compound semiconductor or a group III-V compound semiconductor. The IV-IV group compound semiconductor may be, for example, a binary compound including at least two or more of carbon (C), silicon (Si), germanium (Ge) and tin (Sn), a ternary compound, or a compound obtained by doping these elements with a group IV element. The group III-V compound semiconductor, for example, may be one of a binary compound, a ternary compound or a quaternary compound formed by combining at least one of aluminum (Al), gallium (Ga) and indium (In) as a group III element and one of phosphorus (P), arsenic (As), antimonium (Sb) as a group V element.

The first field insulating layer 105 may fill a part of the fin trench 105t. The first field insulating layer 105 may be disposed on a part of the sidewalls of the longer side 110a, 210a, 310a and 410a of the first to fourth fin patterns.

The second field insulating layer 106 may fill at least a part of the first fin-cut trench 106t. For example, the second field insulating layer 106 may fill a part of the first fin-cut trench 106t. The second field insulating layer 106 may be disposed on a part of sidewalls of the shorter side 110b of the first fin pattern and the shorter side 210b of the second fin pattern. The second field insulating layer 106 may be separated by the first field insulating layer 105 extending long in the first direction X1.

The third field insulating layer 107 may fill at least a part of the second fin-cut trench 107t. For example, the third field insulating layer 107 may fill a part of the second fin-cut trench 107t. The third field insulating layer 107 may be disposed on a part of the sidewalls of the shorter side 310b of the third fin pattern and the shorter side 410b of the fourth fin pattern. The third field insulating layer 107 may be separated by the first field insulating layer 105 extending long in the first direction X1.

The first to third field insulating layers 105, 106 and 107 may be isolation layers for electrically separating the first to fourth fin patterns 110, 210, 310 and 410 usable for the channel region of the finFET.

In the semiconductor device according to some embodiments of the present disclosure, the upper surface of the second field insulating layer 106 may be lower than the upper surface of the first fin pattern 110 and the upper surface of the second fin pattern 210. The upper surface of the third field insulating layer 107 may be lower than the upper surface of the third fin pattern 310 and the upper surface of the fourth fin pattern 410.

The first to third field insulating layers 105, 106 and 107 may include, for example, at least one of a silicon oxide layer, a silicon nitride layer, and a silicon oxynitride layer.

Each of the first to fourth gate structures 120, 220, 320 and 420 may extend lengthwise in the second direction Y1 on the substrate 100. Each of the first to fourth gate structures 120, 220, 320 and 420 may be spaced apart from each other in the first direction X1.

The first gate structure 120 may intersect the first fin pattern 110 on the first fin pattern 110. The first gate structure 120 may overlap a terminal end of the first fin pattern 110 including the shorter side 110b of the first fin pattern. The first gate structure 120 may extend along the upper surface of the first fin pattern 110.

The second gate structure 220 may intersect the second fin pattern 210 on the second fin pattern 210. The second gate structure 220 may overlap the terminal end of the second fin pattern 210 including the shorter side 210b of the second fin pattern. The second gate structure 220 may extend along the upper surface of the second fin pattern 210.

The first gate structure 120 and the second gate structure 220 may not be disposed on the upper surface of the second field insulating layer 106. The first gate structure 120 and the second gate structure 220 may be disposed on the upper surface of the third field insulating layer 107.

The first gate structure 120 and the second gate structure 220 may be disposed between the third fin pattern 310 and the fourth fin pattern 410. The first gate structure 120 and the second gate structure 220 may traverse between the shorter side 310b of the third fin pattern and the shorter side 410b of the fourth fin pattern.

The third gate structure 320 may intersect the first and third fin patterns 110 and 310 on the first and third fin patterns 110 and 310. The fourth gate structure 420 may intersect the second and fourth fin patterns 210 and 410 on the second and fourth fin patterns 210 and 410. The third and fourth gate structures 320 and 420 do not overlap the terminal ends of the first and second fin patterns 110 and 210, respectively.

The first gate structure 120 may not wrap around the terminal end of the first fin pattern 110 including the shorter side 110b of the first fin pattern 110. The second gate structure 220 may not wrap around the terminal end of the second fin pattern 210 including the shorter side 210b of the second fin pattern. In other words, the first gate structure 120 may not be disposed on the sidewall of the first fin pattern 110 on the shorter side 110b of the first fin pattern. The second gate structure 220 may not be placed on the sidewall of the second fin pattern 210 that defines the shorter side 210b of the second fin pattern.

For example, the width W11 of the first fin-cut trench 106t in the first direction X1 may be substantially the same as a distance W22 between the first gate structure 120 on the first fin pattern 110 and the second gate structure 220 on the second fin pattern 210.

The first gate structure 120 may be in contact with the third fin pattern 310. The fourth fin pattern 410 may be in contact with the fourth fin pattern 410. The first gate structure 120 may wrap the terminal end of the third fin pattern 310 including the shorter side 310b of the third fin pattern. The second gate structure 220 may wrap the terminal end of the fourth fin pattern 410 including the shorter side 410b of the fourth fin pattern. In other words, the first gate structure 120 may be disposed on the sidewall of the third fin pattern 310 that defines the shorter side 310b of the third fin pattern. A second gate structure 220 may be disposed on the sidewall of the fourth fin pattern 410 that defines the shorter side 410b of the fourth fin pattern.

A spaced distance between the first gate structure 120 and the second gate structure 220 in the first region R1 may be substantially the same as a spaced distance between the first gate structure 120 and the second gate structure 220 in the second region R2.

Each of the first to fourth gate structures 120, 220, 320 and 420 may include gate electrodes 130, 230, 330 and 430, gate insulating layers 135, 235, 335 and 435, gate spacers 140, 240, 340 and 440, gate trenches 140*t*, 240*t*, 340*t* and 440*t* defined by the gate spacers 140, 240, 340 and 440, and capping patterns 145, 245, 345 and 445.

The first to fourth gate insulating layers 135, 235, 335 and 435 may extend along the sidewalls and the bottom surfaces of the respective gate trenches 140*t*, 240*t*, 340*t* and 440*t*. Each of the first to fourth gate insulating layers 135, 235, 335 and 435 may include a high dielectric constant insulating layer.

The high dielectric constant insulating layer may include a high dielectric material having a dielectric constant higher than that of the silicon oxide layer. Each of the first to fourth gate insulating layers 135, 235, 335 and 435 may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

The first to fourth gate electrodes 130, 230, 330 and 430 may be disposed on the respective gate insulating layers 135, 235, 335 and 435. Each of the first to fourth gate electrodes 130, 230, 330 and 430 may fill at least some parts of the gate trenches 140*t*, 240*t*, 340*t* and 440*t*.

The first gate electrode 130 may be disposed on the first fin pattern 110. The first gate electrode 130 may not extend along the upper surface of the second field insulating layer 106. In other words, a width of the bottom surface of the first gate electrode 130 extending along the upper surface of the first fin pattern 110 may be the same as a width W31 of the first gate electrode 130 in the first direction X1.

The first gate electrode 130 may not be disposed on the third fin pattern 310. The bottom surface of the first gate electrode 130 may not extend onto the upper surface of the third fin pattern 310. The first gate electrode 130 may be disposed on the third field insulating layer 107. The first gate electrode 130 may extend in the first direction X1 along the upper surface of the third field insulating layer 107.

The second gate electrode 230 may be disposed on the second fin pattern 210. The second gate electrode 230 may not extend along the upper surface of the second field insulating layer 106. In other words, the width of the bottom surface of the second gate electrode 230 extending along the upper surface of the second fin pattern 210 may be the same as a width W32 of the second gate electrode 230 in the first direction X1.

The second gate electrode 230 may not be disposed on the fourth fin pattern 410. The bottom surface of the second gate electrode 230 may not extend onto the upper surface of the fourth fin pattern 410. The second gate electrode 230 may be disposed on the third field insulating layer 107. The second gate electrode 230 may extend in the first direction X1 along the upper surface of the third field insulating layer 107.

The first gate electrode 130 and the second gate electrode 230 may cross the part between the third fin pattern 310 and the fourth fin pattern 410.

A distance W21 by which the first gate electrode 130 and the second gate electrode 230 are spaced apart from each other in the first direction X1 may be greater than the width W11 of the first fin-cut trench 106*t*. The distance W21 by which the first gate electrode 130 and the second gate electrode 230 are spaced apart from each other in the first direction X1 may be based on the bottom surface of the first gate electrode 130 on the first fin pattern 110 and the bottom surface of the second gate electrode 230 on the upper surface of the second fin pattern 210.

The bottom surface of the first gate electrode 130 and the bottom surface of the second gate electrode 230 may not overlap the first fin-cut trench 106*t*. Here, the expression "the bottom surface and the trench overlap each other" means that a part of the bottom surface extends in the first direction X1 along an inlet portion of the trench. For example, the inlet portion of the first fin-cut trench 106*t* may be between the upper surface of the first fin pattern 110 and the upper surface of the second fin pattern 210.

Or, the expression "the bottom surface and the trench overlap each other" means that the bottom surface and the trench overlap each other in a thickness direction of the substrate 100.

Each of the first to fourth gate electrodes 130, 230, 330 and 430 may include, for example, at least one of titanium nitride (TiN), tantalum carbide (TaC), tantalum nitride (TaN), titanium silicon nitride (TiSiN), tantalum silicon nitride (TaSiN), titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof.

The first to fourth gate spacers 140, 240, 340 and 440 may be disposed on the sidewalls of the first to fourth gate electrodes 130, 230, 330 and 430, respectively.

The first gate spacer 140 may be disposed on the upper surface of the first fin pattern 110. The first gate spacer 140 may not overlap in the thickness direction of the second field insulating layer 106 and the substrate 100.

The first gate spacer 140 may be disposed on the upper surface of the third fin pattern 310. The first gate spacer 140 disposed on one side of the first gate electrode 130 may be disposed on the upper surface of the third fin pattern 310. At least a part of the first gate spacer 140 disposed on one side of the first gate electrode 130 may extend along the upper surface of the third fin pattern 310. The first gate spacer 140 disposed on the other side of the first gate electrode 130 may be disposed on the upper surface of the third field insulating layer 107.

The second gate spacer 240 may be disposed on the upper surface of the second fin pattern 210. The second gate spacer 240 may not overlap the second field insulating layer 106 in the thickness direction of the substrate 100.

The second gate spacer 240 may be disposed on the upper surface of the fourth fin pattern 410. The second gate spacer 240 disposed on one side of the second gate electrode 230 may be disposed on the upper surface of the fourth fin pattern 410. At least a part of the second gate spacer 240 disposed on one side of the second gate electrode 230 may extend along the upper surface of the fourth fin pattern 410. The second gate spacer 240 disposed on the other side of the second gate electrode 230 may be disposed on the upper surface of the third field insulating layer 107.

Each of the first to fourth gate spacers 140, 240, 340 and 440 may include, for example, at least one of silicon nitride (SiN), silicon oxynitride (SiON), silicon oxide (SiO$_2$), and silicon oxycarbonitride (SiOCN).

Each of the first to fourth capping patterns 145, 245, 345 and 445 may be formed on the gate electrodes 130, 230, 330 and 430 and the respective gate spacers 140, 240, 340 and 440. Each of the first to fourth capping patterns 145, 245, 345 and 445 may include, for example, at least one of silicon oxide ($SiO_2$), silicon nitride (SiN), silicon oxynitride (SiON), silicon carbonitride (SiCN), and silicon oxycarbonitride (SiOCN). In FIG. 2 to FIG. 4, the respective capping patterns 145, 245, 345 and 445 are illustrated as not filling a part of the gate trenches 140t, 240t, 340t and 440t, but this is only for convenience of explanation, and the present disclosure is not limited thereto.

In FIG. 1, the first to fourth gate structures 120, 220, 320 and 420 extend over the first region R1 and the second region R2, but this is only for convenience of explanation, and the present disclosure is not limited thereto.

In other words, the gate structures 120, 220, 320 and 420 arranged in the first region R1 are directly connected to the gate structures 120, 220, 320, and 420 arranged in the second region R2. However, in some embodiments, the gate structures 120, 220, 320 and 420 may be arranged only in the first region R1. In such a case, other gate structures may be arranged in the second region. The gate structures arranged in the second region R2 may not be connected directly to the gate structures 120, 220, 320 and 420 arranged in the first region R1.

The first epitaxial pattern 150 may be formed on the first fin pattern 110. The second epitaxial pattern 250 may be formed on the second fin pattern 210. The third epitaxial pattern 350 may be formed on the third fin pattern 310. The fourth epitaxial pattern 450 may be formed on the fourth fin pattern 410.

The first epitaxial pattern 150 may serve as a source/drain of the transistor which uses the first fin pattern 110 as a channel region. The second epitaxial pattern 250 may serve as the source/drain of the transistor which uses the second fin pattern 210 as a channel region. The third epitaxial pattern 350 may serves as the source/drain of the transistor which uses the third fin pattern 310 as a channel region. The fourth epitaxial pattern 450 may serve as the source/drain of the transistor which uses the fourth fin pattern 410 as a channel region.

A lower interlayer insulating layer 191 may be formed on the first to third field insulating layers 105, 106 and 107 to cover the first to fourth epitaxial patterns 150, 250, 350 and 450. The lower interlayer insulating layer 191 may be formed around the first to fourth gate structures 120, 220, 320 and 420. The lower interlayer insulating layer 191 may cover at least a part of sidewalls of the first to fourth gate structures 120, 220, 320 and 420.

The lower interlayer insulating layer 191 may fill a part of the first fin-cut trench 106t. The lower interlayer insulating layer 191 may be disposed on the second field insulating layer 106. The lower interlayer insulating layer 191 may fill the second fin-cut trench 107t which remains after being filled by the third field insulating layer 107, the first gate structure 120, and the second gate structure 220.

The upper surface of the lower interlayer insulating layer 191 may be placed on the same plane as the upper surfaces of each of the first to fourth capping patterns 145, 245, 345 and 445.

Although it is not illustrated, the lower interlayer insulating layer 191 may further include an etching prevention layer extending along the upper surfaces of the first to fourth epitaxial patterns 150, 250, 350, and 450.

The upper interlayer insulating layer 192 is formed on the lower interlayer insulating layer 191 and the first to fourth gate structures 120, 220, 320 and 420. The interlayer insulating layer 190 includes a lower interlayer insulating layer 191 and an upper interlayer insulating layer 192. Each of the lower interlayer insulating layer 191 and the upper interlayer insulating layer 192 may include, but is not limited to, for example, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicone Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof.

Figure 5:
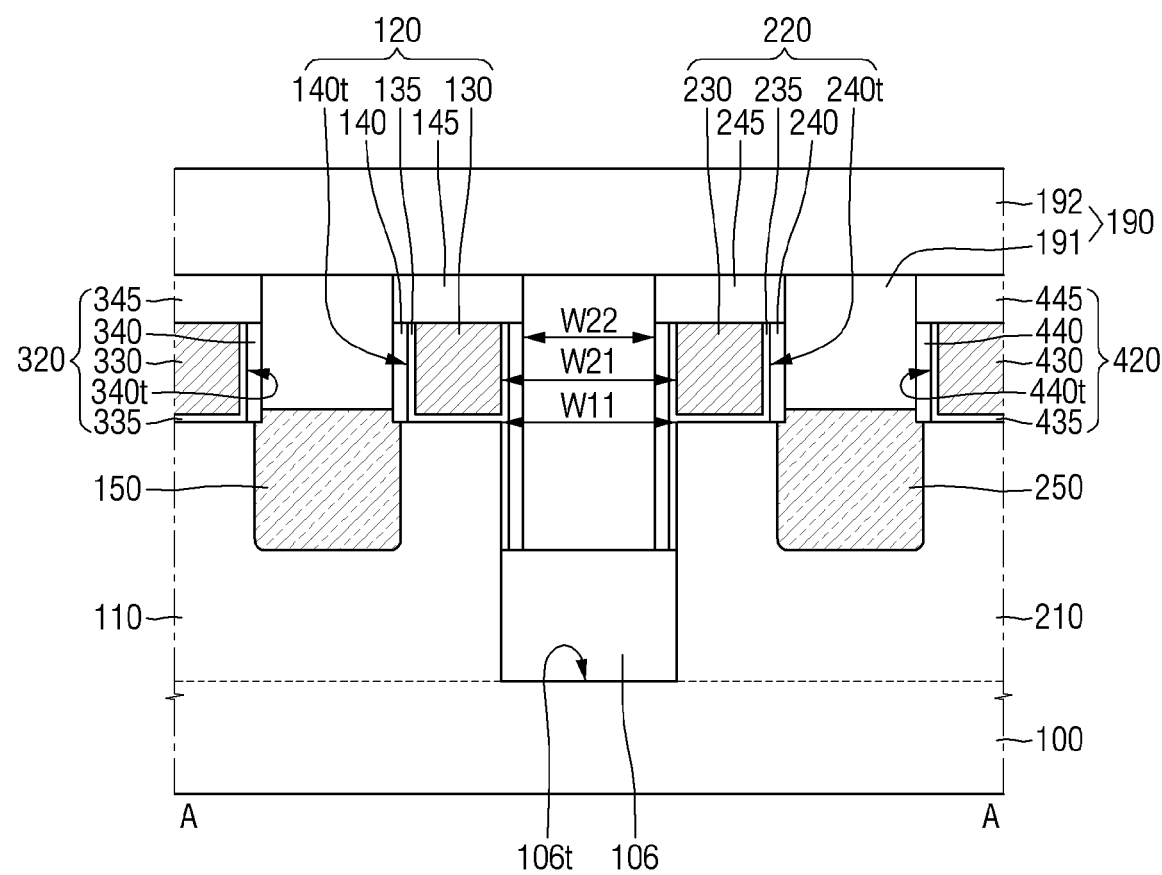
FIG. 5 is a diagram illustrating a semiconductor device according to some embodiments of the present disclosure.

FIG. 5 is a diagram illustrating a semiconductor device according to some embodiments of the present disclosure. For the sake of convenience of explanation, differences from those described with reference to FIG. 1 to FIG. 4 will be mainly described.

Referring to FIG. 5, in the semiconductor device according to some embodiments of the present disclosure, a distance W21 by which the first gate electrode 130 and the second gate electrode 230 are spaced apart from each other in the first direction X1 may be substantially the same as the width W11 of the first fin-cut trench 106t. A bottom surface of the first gate electrode 130 includes a portion extending along the upper surface of the first fin pattern 110, and may not extend along the upper surface of the second field insulating layer 106. The bottom surface of the second gate electrode 230 includes a portion extending along the upper surface of the second fin pattern 210, and may not extend along the upper surface of the second field insulating layer 106.

The first gate structure 120 may wrap around the terminal end of the first fin pattern 110 including the shorter side 110b of the first fin pattern. The second gate structure 220 may wrap around the terminal end of the second fin pattern 210 including the shorter side 210b of the second fin pattern. In other words, the first gate structure 120 may be disposed on the sidewall of the first fin pattern 110 on the shorter side 110b of the first fin pattern. The second gate structure 220 may be disposed on the sidewall of the second fin pattern 210 on the shorter side 210b of the second fin pattern.

The width W11 of the first fin-cut trench 106t in the first direction X1 may be greater than distance W22 between the first gate structure 120 on the first fin pattern 110 and the second gate structure 220 on the second fin pattern 210.

The first gate spacer 140 disposed on one side of the first gate electrode 130 may extend along the upper surface of the first fin pattern 110. The first gate spacer 140 disposed on the other side of the first gate electrode 130 may be disposed on the upper surface of the second field insulating layer 106.

The second gate spacer 240 disposed on one side of the second gate electrode 230 may extend along the upper surface of the second fin pattern 210. The second gate spacer 240 disposed on the other side of the second gate electrode 230 may be disposed on the upper surface of the second field insulating layer 106.

Figure 6:
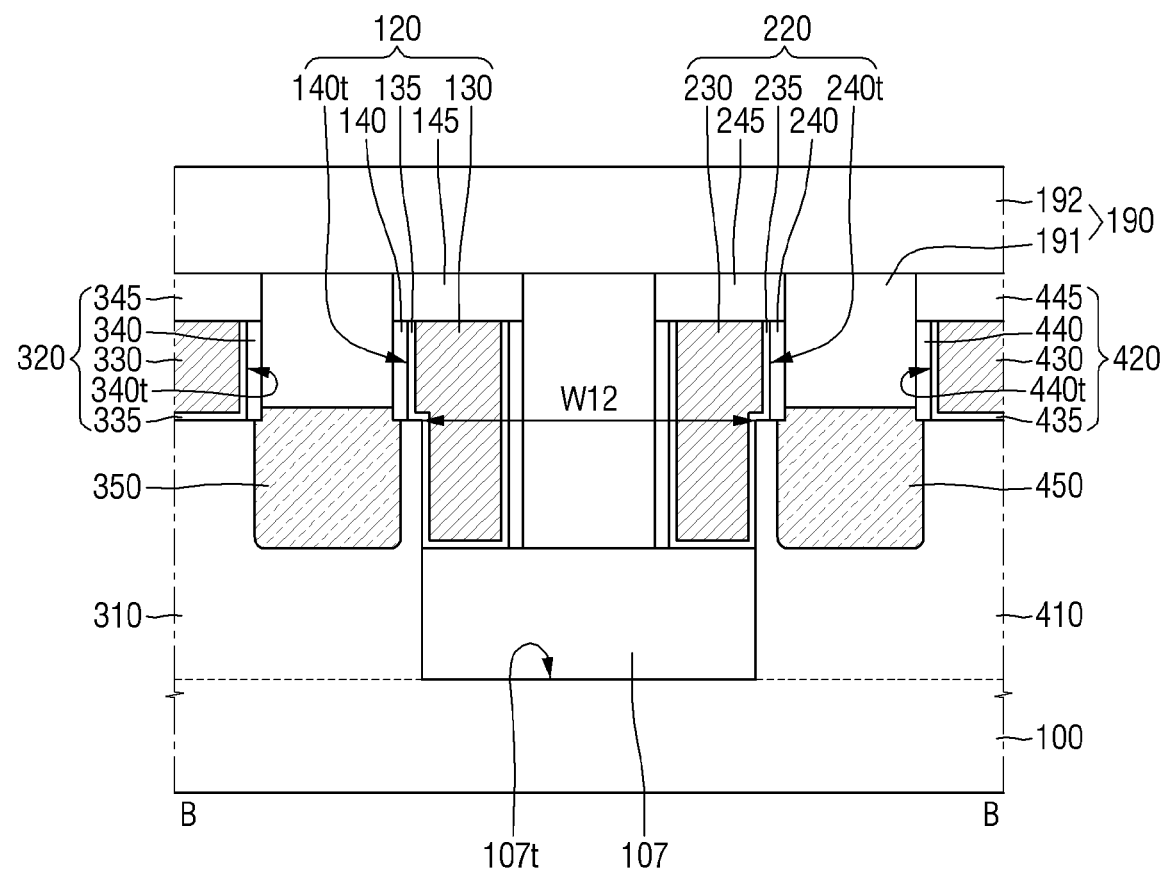
FIG. 6 is a diagram illustrating the semiconductor device according to some embodiments of the present disclosure.

FIG. 6 is a diagram illustrating the semiconductor device according to some embodiments of the present disclosure. For the sake of convenience of explanation, differences from those described with reference to FIG. 1 to FIG. 4 will be mainly described.

Referring to FIG. 6, in the semiconductor device according to some embodiments of the present disclosure, a part of the first gate electrode 130 may be disposed on the third fin pattern 310. A part of the second gate electrode 230 may be disposed on the fourth fin pattern 410.

The bottom surface of the first gate electrode 130 may include a portion extending along the upper surface of the third fin pattern 310, and a portion extending along the upper surface of the third field insulating layer 107. The bottom surface of the second gate electrode 230 may include a portion extending along the upper surface of the fourth fin pattern 410, and a portion extending along the upper surface of the third field insulating layer 107.

Figure 7:
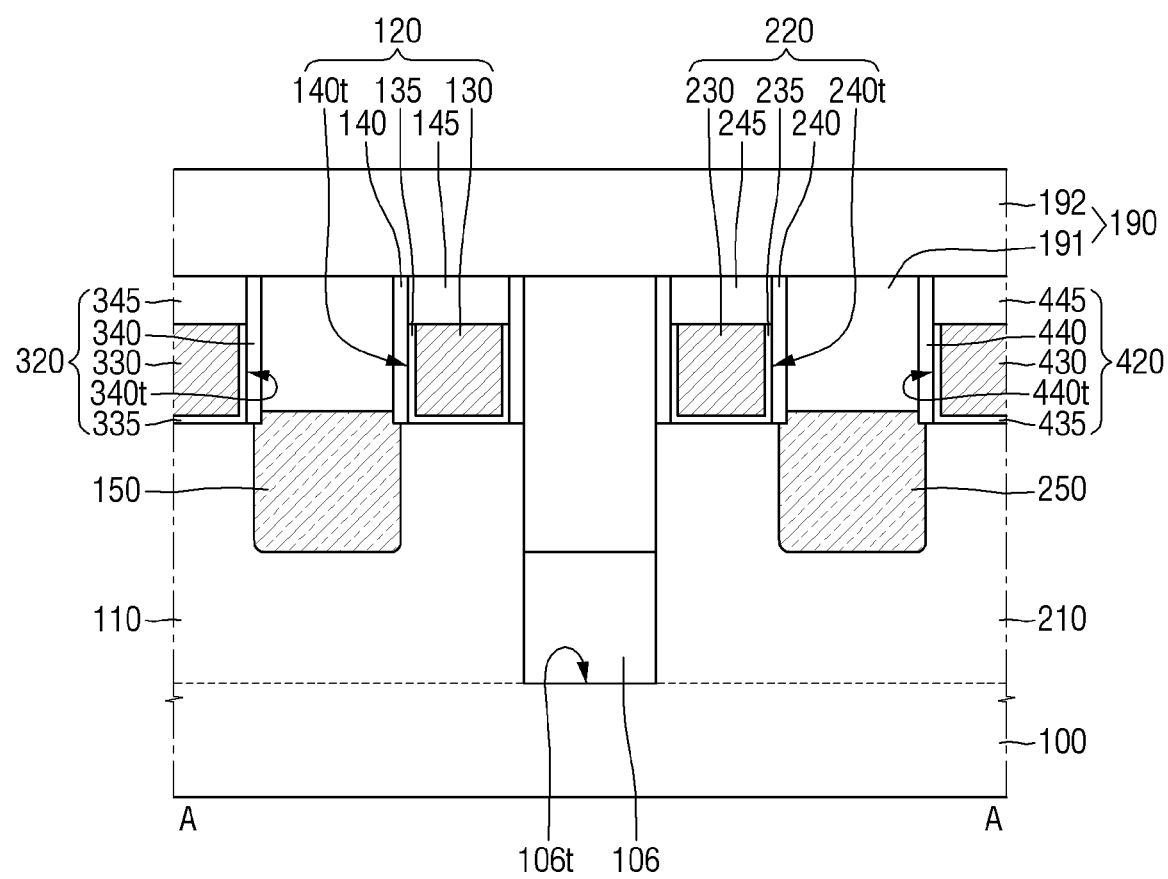
FIG. 7 is a diagram illustrating the semiconductor device according to some embodiments of the present disclosure.
Figure 8:
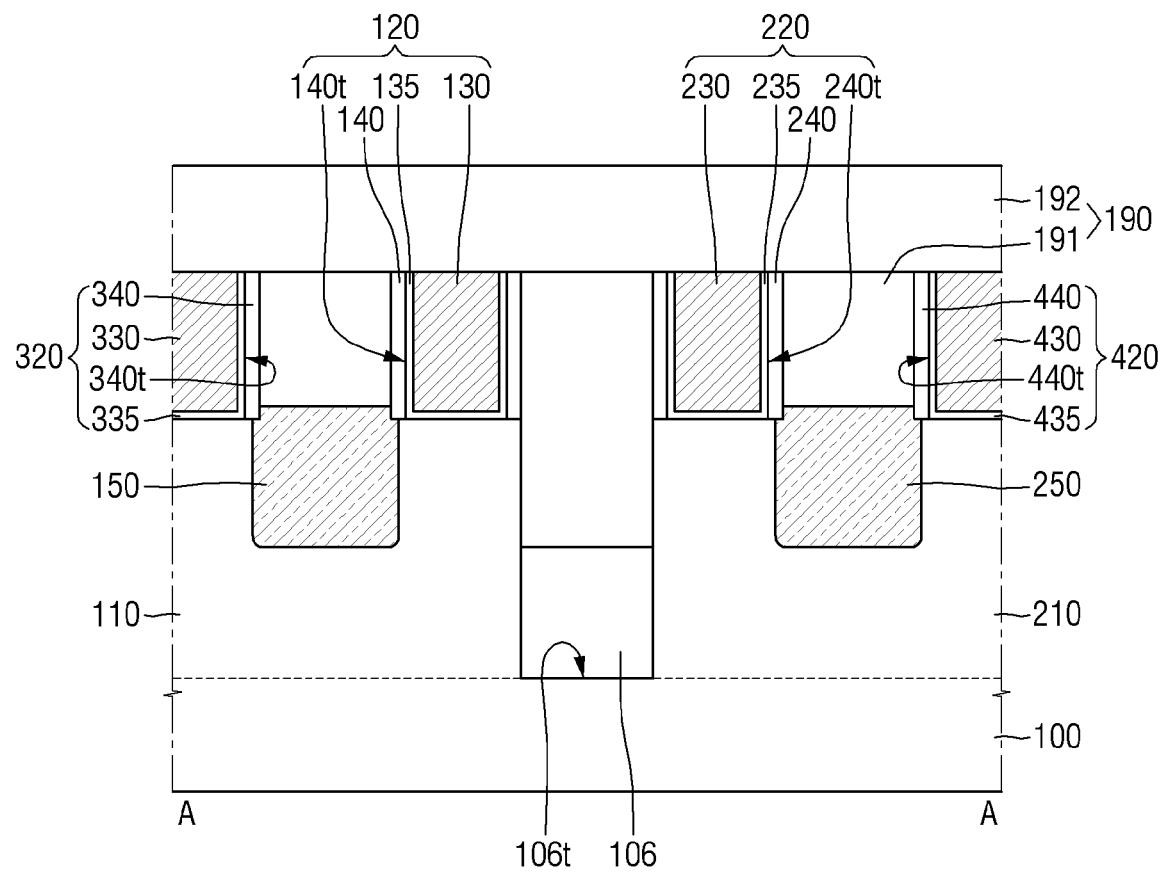
FIG. 8 is a diagram illustrating the semiconductor device according to some embodiments of the present disclosure.

FIGS. 7 and 8 are diagrams illustrating semiconductor devices according to some embodiments of the present disclosure. For the sake of brevity, differences with respect to the device shown in FIG. 1 to FIG. 4 will be described.

Referring to FIG. 7, in a semiconductor device according to some embodiments of the present disclosure, each of the first to fourth gate electrodes 130, 230, 330 and 430 may fill some parts of the first to fourth gate trenches 140t, 240t, 340t and 440t. Each of the first to fourth capping patterns 145, 245, 345 and 445 may fill the gate trenches 140t, 240t, 340t and 440t which remain after the gate electrodes 130, 230, 330 and 430 are formed. The upper surfaces of the first to fourth gate spacers 140, 240, 340 and 440 may be placed on the same plane as the upper surfaces of the first to fourth capping patterns 145, 245, 345 and 445. The first to fourth gate insulating layers 135, 235, 335 and 435 are illustrated as not extending between the first to fourth capping patterns 145, 245, 345 and 445 and the first to fourth gate spacers 140, 240, 340 and 440, but the present disclosure is not limited thereto.

Referring to FIG. 8, in a semiconductor device according to further embodiments of the present disclosure, the upper surfaces of the first to fourth gate electrodes 130, 230, 330 and 430 may be placed on the same plane as the upper surfaces of the lower interlayer insulating layer 191. The first to fourth gate structures 120, 220, 320 and 420 may not include capping patterns 145, 245, 345 and 445, respectively.

Figure 9:
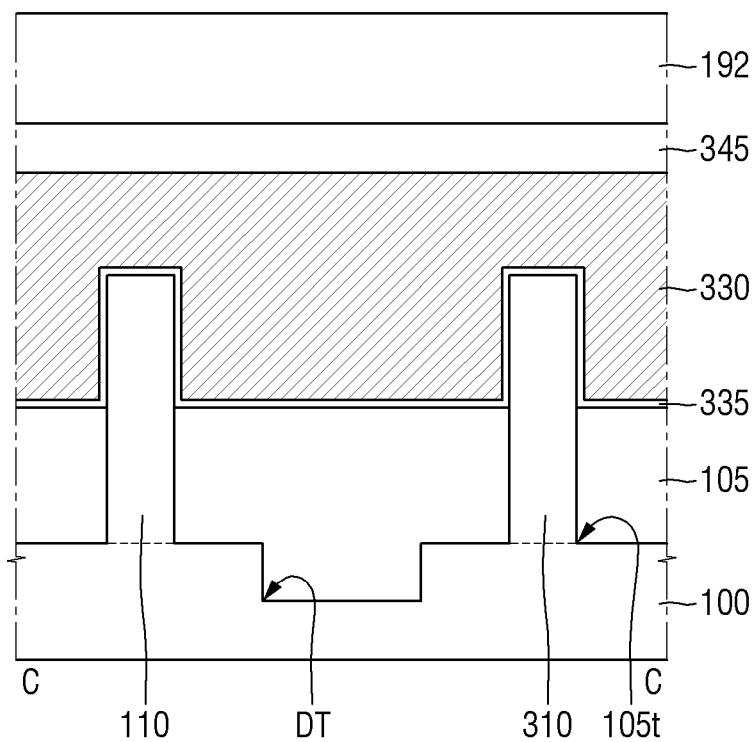
FIG. 9 is a diagram illustrating the semiconductor device according to some embodiments of the present disclosure.
Figure 10:
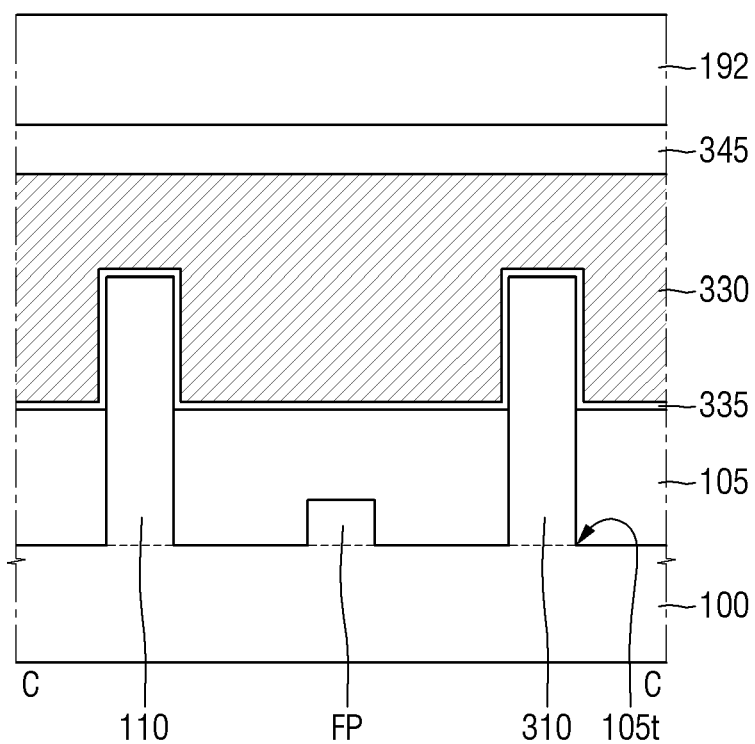
FIG. 10 is a diagram illustrating the semiconductor device according to some embodiments of the present disclosure.

FIGS. 9 and 10 are diagrams illustrating semiconductor devices according to some embodiments of the present disclosure. For the sake of brevity, differences with respect to the device shown in FIG. 1 to FIG. 4 will be described.

Referring to FIG. 9, an active trench DT may be formed in the substrate 100 between the first fin pattern 110 and the third fin pattern 310. The active trench DT may be disposed in the field region between the first region R1 and the second region R2. The active trench DT may be deeper than a fin trench 105t which defines the longer side (110a in FIG. 1) of the first fin pattern and the longer side (310a in FIG. 1) of the third fin pattern. The first field insulating layer 105 fills the active trench DT.

Referring to FIG. 10, a semiconductor device according to some embodiments of the present disclosure may further include a protrusion pattern FP protruding from the substrate 100, between the first fin pattern 110 and the third fin pattern 310. The protrusion pattern FP may be disposed in a field region between the first region R1 and the second region R2. The height of the protrusion pattern FP is less than the height of the first fin pattern 110 and the height of the third fin pattern 310. The height of the protrusion pattern FP is less than the height of the first field insulating layer 105 of the portion overlapping the third gate electrode 330.

In other words, the upper surface of the protrusion pattern FP may be covered with the first field insulating layer 105. The protrusion pattern FP may extend, for example, in the first direction (X1 of FIG. 1), but the present disclosure is not limited thereto.

Figure 11:
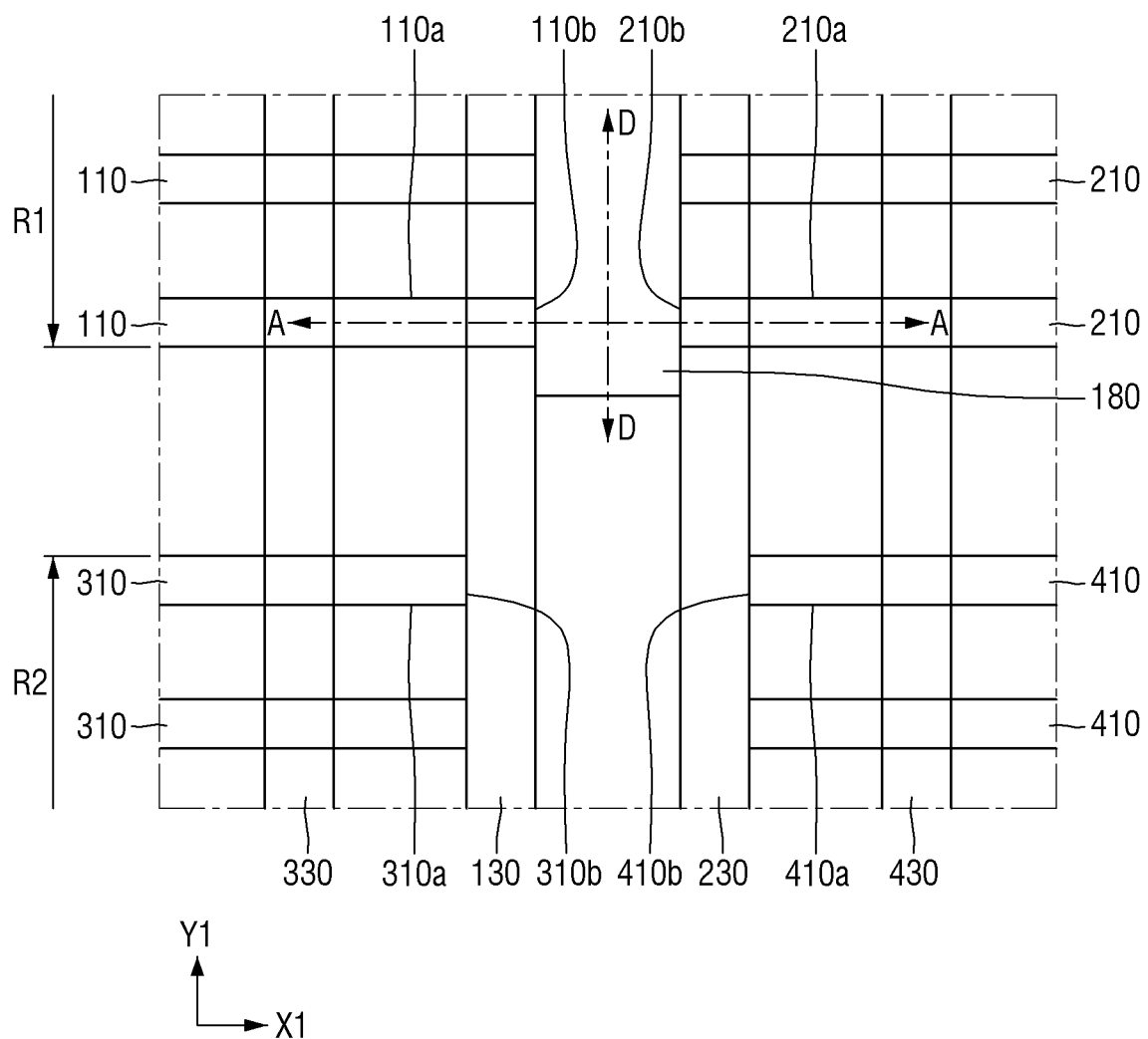
FIG. 11 is a schematic layout diagram illustrating the semiconductor device according to some embodiments of the present disclosure.
Figure 12:
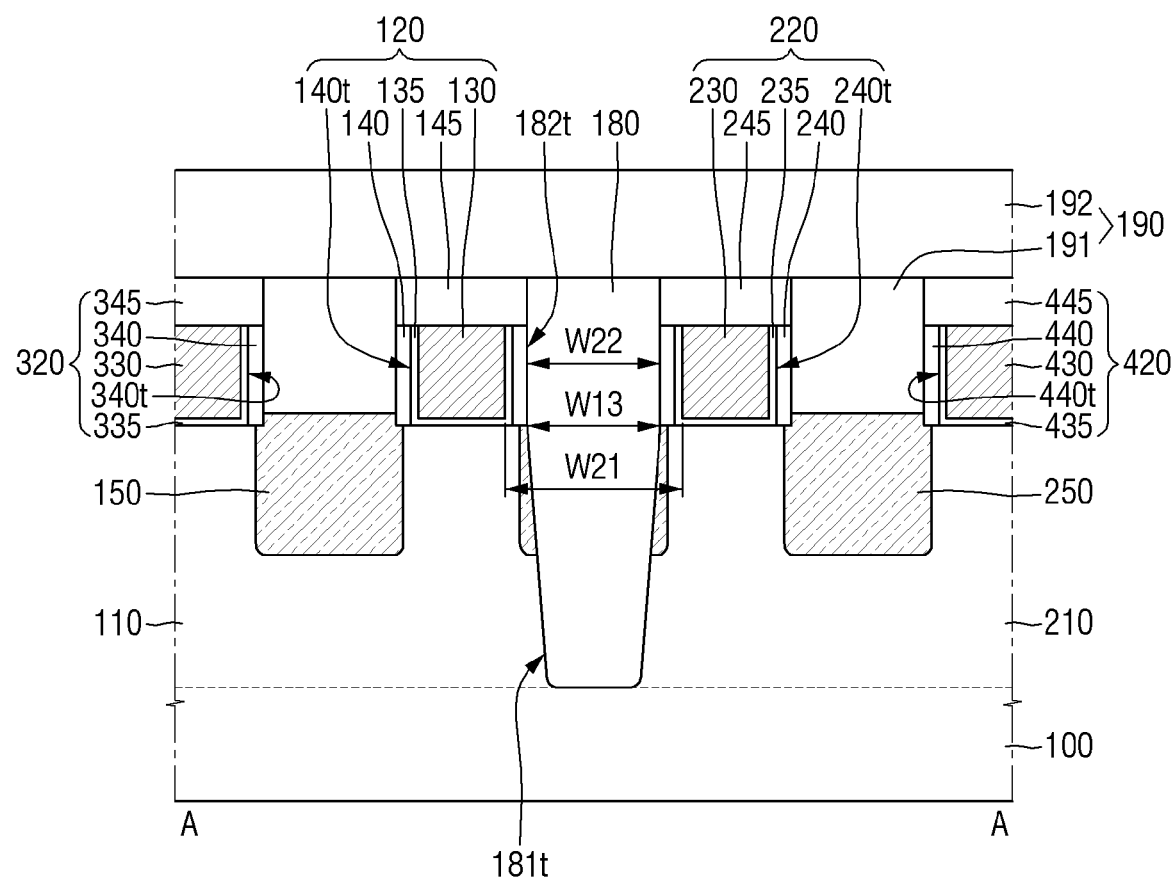
FIG. 12 is a cross-sectional view taken along the line A-A of FIG. 11.
Figure 13:
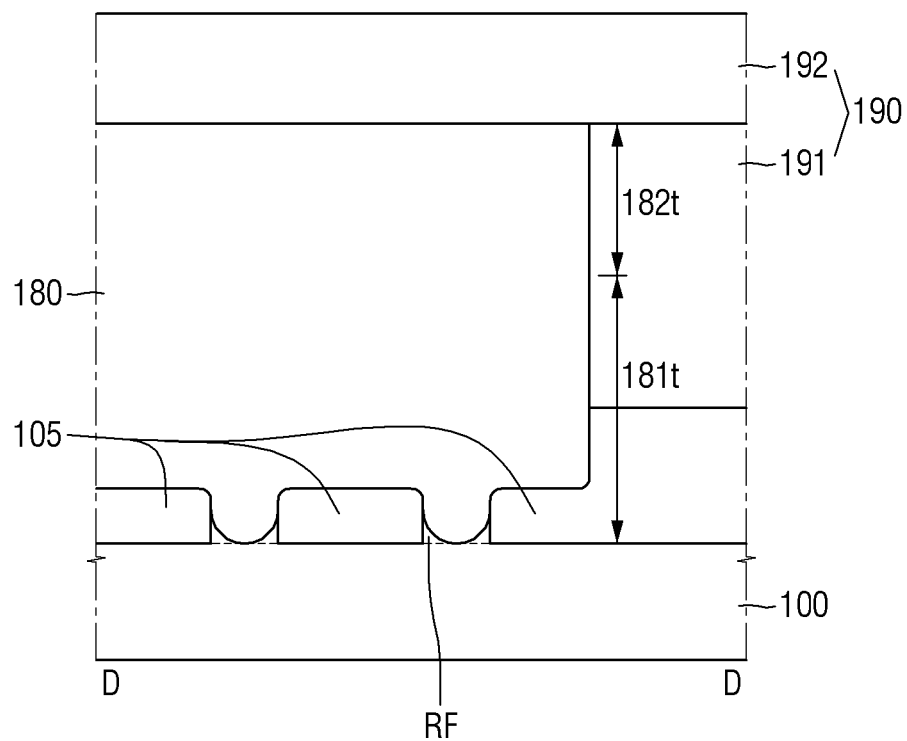
FIG. 13 is a cross-sectional view taken along the line D-D of FIG. 11.

FIG. 11 is a schematic layout diagram illustrating the semiconductor device according to some embodiments of the present disclosure. FIG. 12 is a cross-sectional view taken along the line A-A of FIG. 11. FIG. 13 is a cross-sectional view taken along the line D-D of FIG. 11. For the sake of brevity, differences with respect to the device shown in FIG. 1 to FIG. 4 will be described.

Referring to FIG. 11 to FIG. 13, the semiconductor device according to some embodiments of the present disclosure may further include an isolation structure 180. The isolation structure 180 may be disposed between the first fin pattern 110 and the second fin pattern 210. The isolation structure 180 may be disposed between the shorter side 110b of the first fin pattern and the shorter side 210b of the second fin pattern.

The isolation structure 180 may separate the first fin pattern 110 and the second fin pattern 210 from each other. The isolation structure 180 may be disposed between the first gate structure 120 and the second gate structure 220.

The isolation structure 180 may fill a trench having a lower isolation trench portion 181t and an upper isolation trench portion 182t. A boundary between the lower isolation trench portion 181t and the upper isolation trench portion 182t may be coincide with the upper surface of the first fin pattern 110 and the upper surface of the second fin pattern 210.

The lower isolation trench portion 181t may separate the first fin pattern 110 and the second fin pattern 210 from each other. In FIG. 12, the depth of the lower isolation trench portion 181t is illustrated as being the same as the depth of the fin trench (105t of FIG. 4), but the present disclosure is not limited thereto.

The lower isolation trench portion 181t may be formed after forming the first epitaxial pattern 150 and the second epitaxial pattern 250. The lower isolation trench portion 181t may be formed by removing at least a part of the epitaxial pattern formed between the first epitaxial pattern 150 and the second epitaxial pattern 250.

The upper isolation trench portion 182t may be defined by the sidewall of the first gate structure 120, the sidewall of the second gate structure 220 and the lower interlayer insulating layer 191. The sidewall of the upper isolation trench portion 182t may include a portion that is defined by the first gate spacer 140, the second gate spacer 240, the first capping pattern 145 and the second capping pattern 245. The first gate electrode 130 and the second gate electrode 230 may not be exposed.

The lower isolation trench portion 181t and the upper isolation trench portion 182t may be self-aligned with the sidewall of the first gate structure 120 and the sidewall of the second gate structure 220. A width W13 of the upper isolation trench portion 181t in the first direction X1 may be substantially the same as a distance W22 between the first gate structure 120 on the first fin pattern 110 and the second gate structure 220 on the second fin pattern 210. The width W13 of the upper isolation trench portion 181t in the first direction X1 may coincide with a distance between the first fin pattern 110 and the second fin pattern 210. A distance W21 by which the first gate electrode 130 and the second gate electrode 230 are spaced apart in the first direction X1 may be greater than the width W13 of the upper isolation trench portion 181t.

The height of the upper surface of the isolation structure 180 is higher than the upper surfaces of the first fin pattern 110 and the second fin pattern 210. For example, the upper surface of the isolation structure 180 may be coplanar with the upper surface of the lower interlayer insulating layer 191.

The upper surface of the isolation structure 180 may be higher than or at the same level as the upper surfaces of the first to fourth gate electrodes 130, 230, 330 and 430. In FIG. 12, the upper surface of the isolation structure 180 may be higher than the upper surfaces of the first to fourth gate electrodes 130, 230, 330 and 430. The upper surface of the isolation structure 180 may be coplanar with the upper surfaces of the first to fourth gate structures 120, 220, 320 and 420.

In FIG. 13, a part of the sidewall of the lower isolation trench portion 181t extending in the second direction Y1 may be defined by the first field insulating layer 105. A part of the lower isolation trench portion 181t may penetrate into the first field insulating layer 105, but the present disclosure is not limited thereto.

The bottom surface of the lower isolation trench portion 181t may be defined by the first field insulating layer 105, the substrate 100, and the fins remnants RF. The fin remnants RF may be the portions that remain after removing the fin pattern portion in the etching process of forming the lower isolation trench portion 181t. In some embodiments, there may be no fin remnants RF.

The isolation structure 180 may include, for example, at least one of silicon nitride, silicon oxide, silicon carbide, silicon carbonitride, silicon oxycarbide, silicon oxynitride, silicone oxycarbonitride and aluminum oxide. Although the isolation structure 180 is illustrated as a single layer, the present disclosure is not limited thereto.

Figure 14:
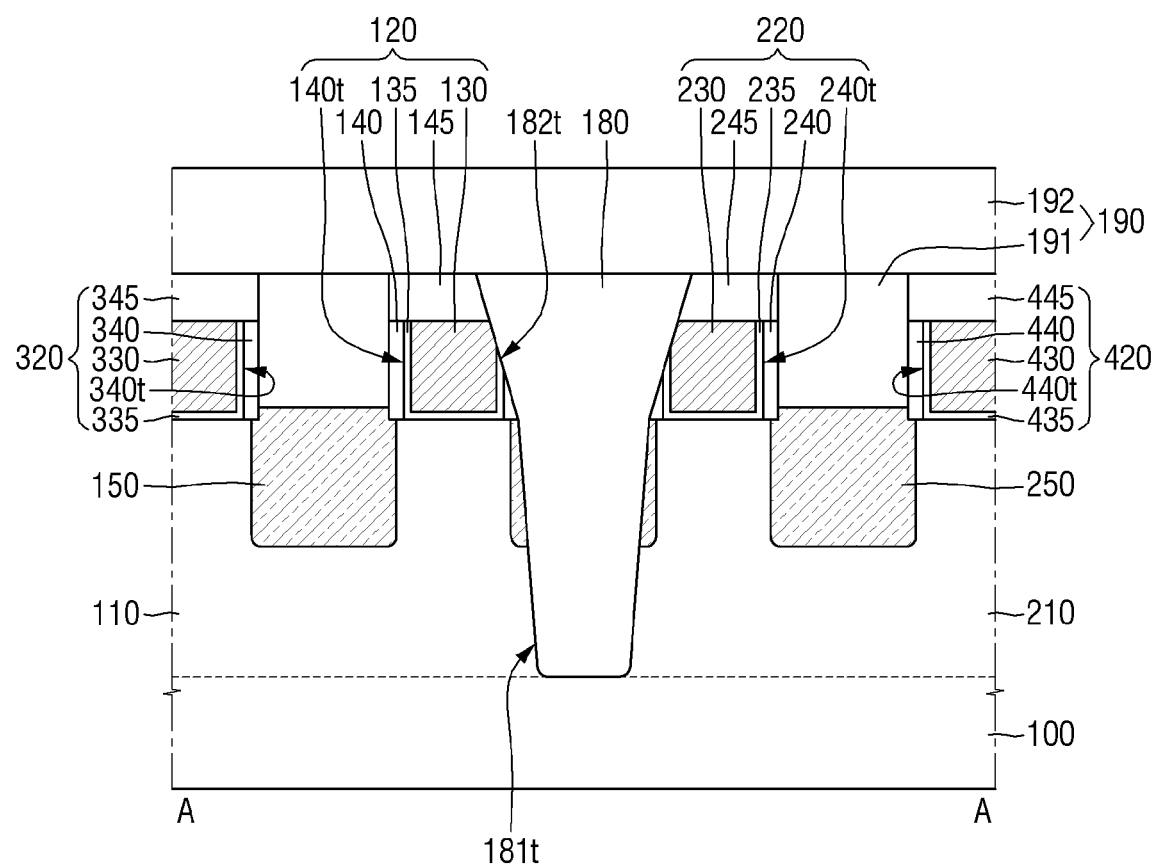
FIG. 14 is a diagram illustrating the semiconductor device according to some embodiments of the present disclosure.

FIG. 14 is a diagram illustrating the semiconductor device according to some embodiments of the present disclosure. For the sake of brevity, differences with respect to the device shown in FIG. 11 to FIG. 13 will be described.

Referring to FIG. 14, in a semiconductor device according to some embodiments of the present disclosure, sidewalls of an upper isolation trench portion 182t may have an acute angle with respect to the upper surface of the first fin pattern 110 and the upper surface of the second fin pattern 210. The first gate electrode 130, the second gate electrode 230, the first gate insulating layer 135 and the second gate insulating layer 235 may be exposed by the upper isolation trench portion 182t.

Figure 15:
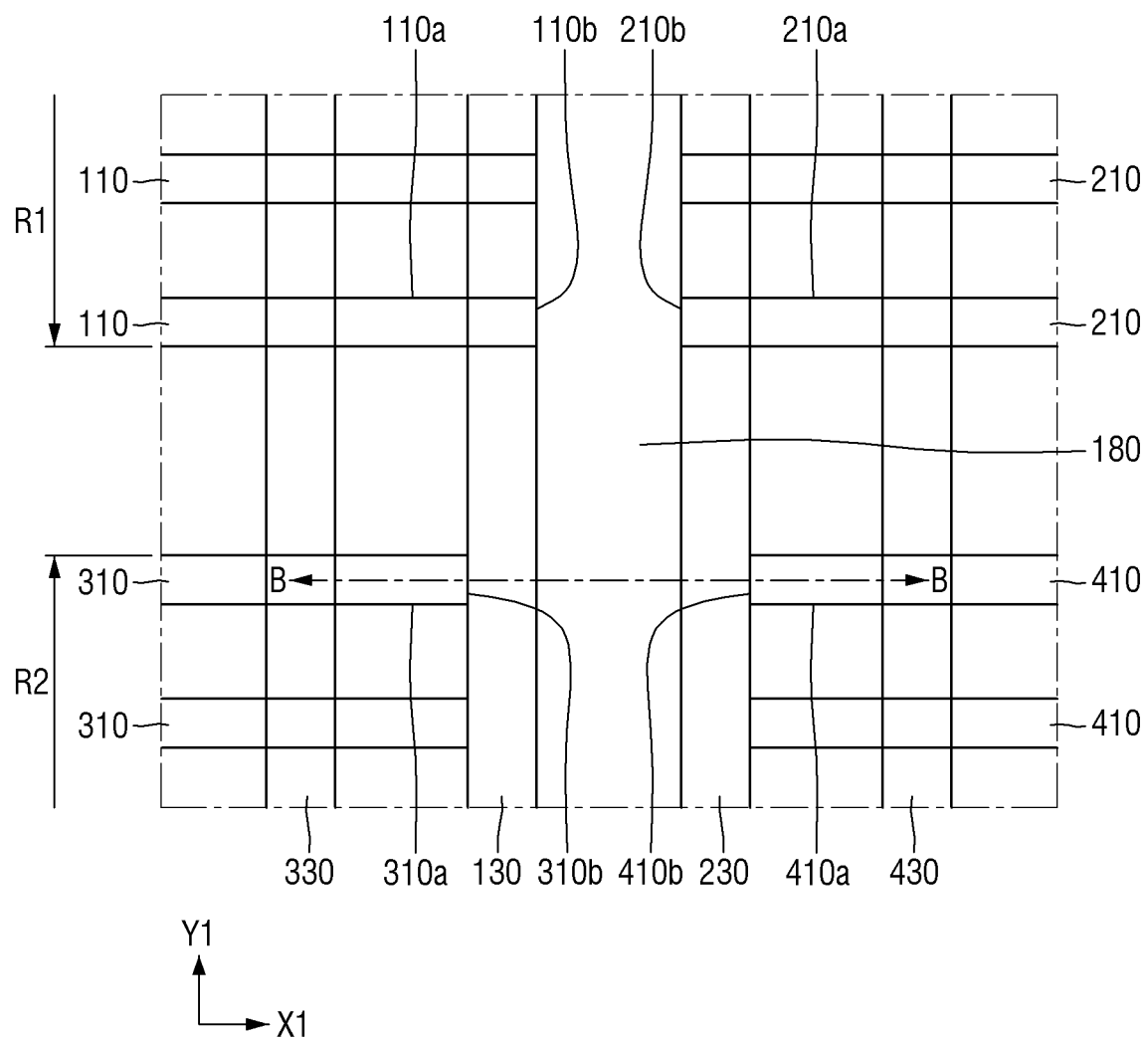
FIG. 15 is a schematic layout diagram illustrating the semiconductor device according to some embodiments of the present disclosure.
Figure 16:
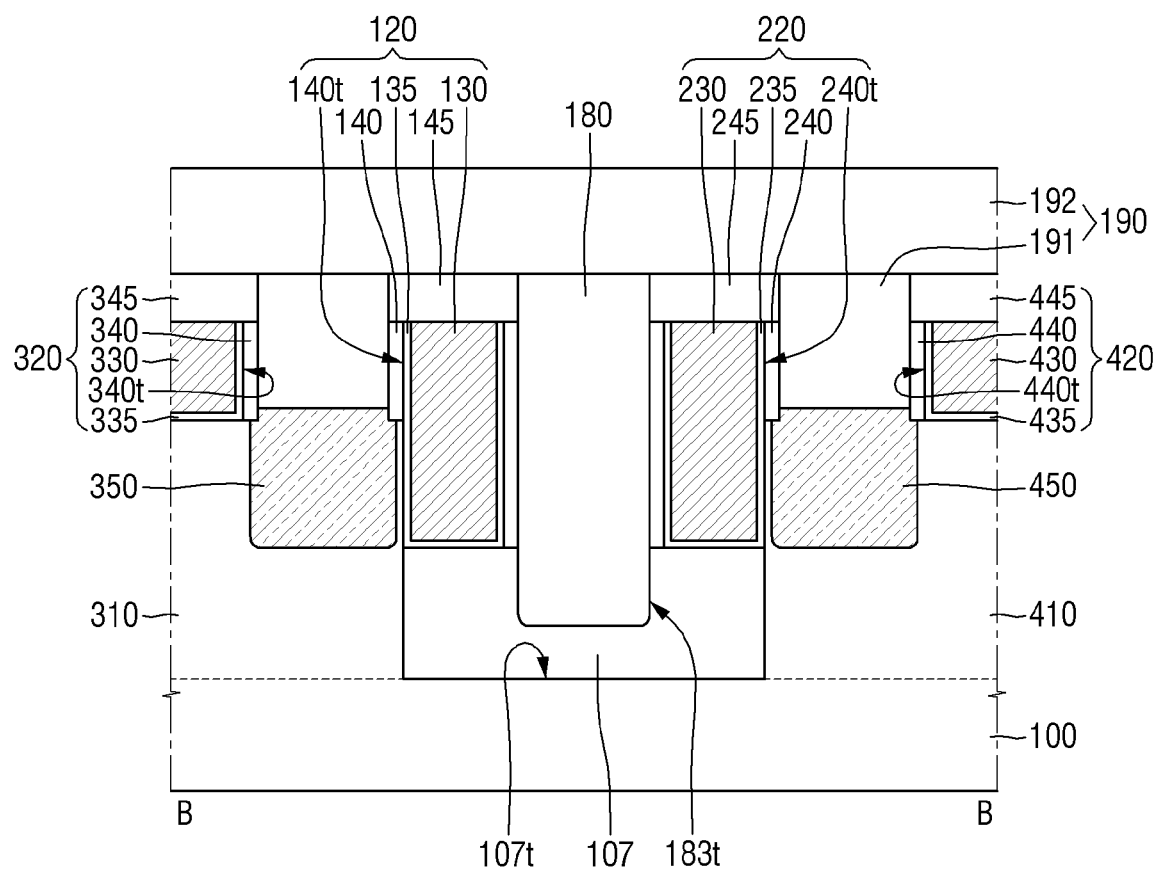
FIG. 16 is a cross-sectional view taken along the line B-B of FIG. 15.

FIG. 15 is a schematic layout diagram illustrating a semiconductor device according to some embodiments of the present disclosure. FIG. 16 is a cross-sectional view taken along the line B-B of FIG. 15. For the sake of convenience of brevity, differences with respect to the device shown in FIG. 11 to FIG. 13 will be described.

Referring to FIG. 15 and FIG. 16, in a semiconductor device according to some embodiments of the present disclosure, an isolation structure 180 may extend between the third fin pattern 310 and the fourth fin pattern 410. The isolation structure 180 may cross not only between the first fin pattern 110 and the second fin pattern 210 but also between the third fin pattern 310 and the fourth fin pattern 410. The isolation structure 180 may be disposed between the shorter side 110b of the first fin pattern and the shorter side 210b of the second fin pattern, and between the shorter side 310b of the third fin pattern and the shorter side 410b of the fourth fin pattern.

The isolation structure 180 may fill a field isolation trench 183t formed in the third field insulating layer 107. A part of the isolation structure 180 may penetrate into the third field insulating layer 107. The field isolation trench 183t may be formed by removal of at least a part of the third field insulating layer 107 during formation of the isolation trench 183t.

Figure 17:
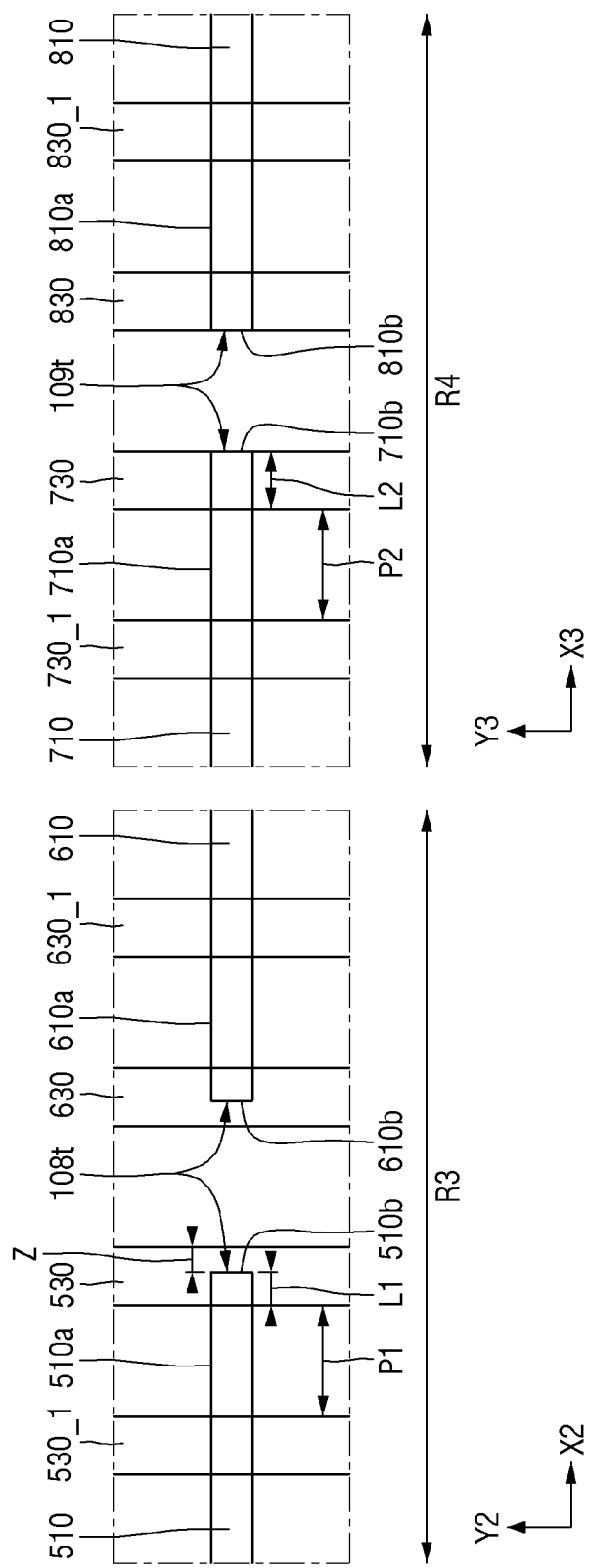
FIG. 17 is a schematic layout diagram illustrating the semiconductor device according to some embodiments of the present disclosure.
Figure 18:
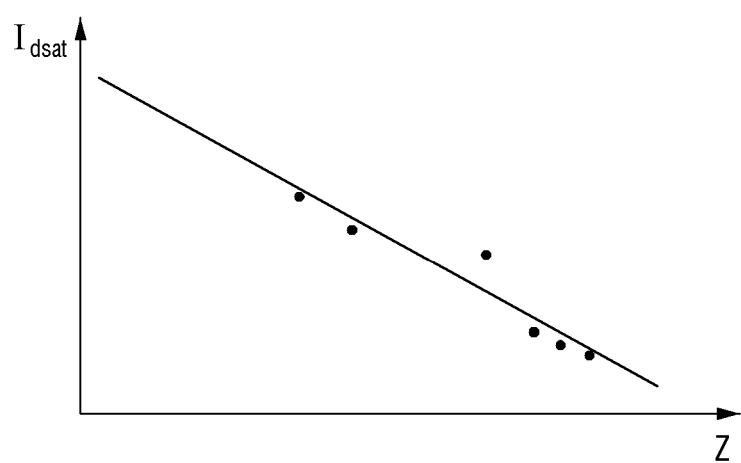
FIG. 18 is a graph illustrating a relation of a saturation current to a width that does not overlap the fin pattern.

FIG. 17 is a schematic layout diagram illustrating a semiconductor device according to some embodiments of the present disclosure. FIG. 18 is a graph illustrating a relation of a saturation current to a width that does not overlap the fin pattern. For the sake of brevity, repeat explanation of structures described with reference to FIG. 1 to FIG. 16 will be simplified or omitted.

In a third region R3, a cross-sectional view taken along a direction in which the fifth fin pattern 510 and the sixth fin pattern 610 extend may be inferred to an ordinary technician belonging to the technical field of the present disclosure through FIG. 2, FIG. 3, FIG. 5, and FIG. 6. In a fourth region R4, a cross-sectional view taken along the direction in which the seventh fin pattern 710 and the eighth fin pattern 810 extend may be inferred to an ordinary technician belonging to the technical field of the present disclosure through FIG. 2, FIG. 3, FIG. 5, and FIG. 6.

Referring to FIG. 17, the semiconductor device according to some embodiments of the present disclosure may include fifth to eighth fin patterns 510, 610, 710 and 810, and fifth to eighth gate electrodes 520, 530_1, 630, 630_1, 730, 730_1, 830 and 830_1. The substrate 100 may include the third region R3 and the fourth region R4. For example, the third region R3 and the fourth region R4 may be NMOS regions.

The fifth fin pattern 510 and the sixth fin pattern 610 may be disposed in the third region R3 of the substrate 100. The fifth and sixth fin patterns 510 and 610 may be aligned lengthwise in a third direction X2. The fifth fin pattern 510 may be spaced apart from the sixth fin pattern 610 in the third direction X2. The fifth and sixth fin patterns 510 and 610 may each include longer sides 510a and 610a extending in the third direction X2.

A shorter side 510b of the fifth fin pattern and a shorter side 610b of the sixth fin pattern may face each other. The fifth fin pattern 510 and the sixth fin pattern 610 may be separated by a third fin-cut trench 108t. The shorter side 510b of the fifth fin pattern and the shorter side 610b of the sixth fin pattern may be defined by the third fin-cut trench 108t.

The fifth gate electrodes 530 and 530_1 may be disposed on the fifth fin pattern 510. The fifth gate electrodes 530 and 530_1 extend in a fourth direction Y2, and may intersect the fifth fin pattern 510. The fifth gate electrodes 530 and 530_1 may include a fifth normal gate electrode 530_1 and a fifth edge gate electrode 530. The fifth normal gate electrode 530_1 does not overlap the terminal end including the shorter side 510b of the fifth fin pattern. The fifth edge gate electrode 530 may intersect and overlap the terminal end including the shorter side 510b of the fifth fin pattern.

The sixth gate electrodes 630 and 630_1 may be disposed on the sixth fin pattern 610. The sixth gate electrodes 630 and 630_1 extend in the fourth direction Y2 and may intersect the sixth fin pattern 610. The sixth gate electrodes 630 and 630_1 may include a sixth normal gate electrode 630_1 and a sixth edge gate electrode 630. The sixth normal gate electrode 630_1 does not overlap the terminal end including the shorter side 610b of the sixth fin pattern. The sixth edge gate electrode 630 may intersect and overlap the terminal end including the shorter side 610b of the sixth fin pattern.

The seventh fin pattern 710 and the eighth fin pattern 810 may be disposed in the fourth region R4 of the substrate 100. The seventh and eighth fin patterns 710 and 810 may be aligned in a fifth direction X3 which is the longitudinal direction. The seventh fin pattern 710 may be spaced apart from the eighth fin pattern 810 in the fifth direction X3. Each of the seventh and eighth fin patterns 710 and 810 may include longer sides 710a, 710a extending in the fifth direction X3.

A shorter side 710b of the seventh fin pattern and a shorter side 810b of the eighth fin pattern may face each other. The seventh fin pattern 710 and the eighth fin pattern 810 may be separated by the fourth fin-cut trench 109t. The shorter side 710b of the seventh fin pattern and the shorter side 810b of the eighth fin pattern may be defined by a fourth fin-cut trench 109t.

The seventh gate electrodes 730 and 730_1 may be disposed on the seventh fin pattern 710. The seventh gate electrodes 730 and 730_1 extend in a sixth direction Y3 and may intersect the seventh fin pattern 710. The seventh normal gate electrode 730_1 does not overlap the terminal end including the shorter side 710b of the seventh fin pattern. The seventh edge gate electrode 730 may intersect and overlap the terminal end including the shorter side 710b of the seventh fin pattern.

The eighth gate electrodes 830 and 830_1 may be disposed on the eighth fin pattern 810. The eighth gate electrodes 830 and 830_1 may extend in the sixth direction Y3 and intersect the eighth fin pattern 810. The eighth normal gate electrode 830_1 does not overlap the terminal end including the shorter side 810b of the eighth fin pattern. The eighth edge gate electrode 830 may intersect and overlap the terminal end including the shorter side 810b of the eighth fin pattern.

For example, the width in the third direction X2 in which the fifth edge gate electrode 530 extends along the upper surface of the fifth fin pattern 510 may be a first length L1. The width in the fifth direction X3 in which the seventh edge gate electrode 730 extends along the upper surface of the seventh fin pattern 710 may be a second length L2.

The width in the third direction X2 in which the fifth edge gate electrode 530 does not overlap the fifth fin pattern 510 may be an untuck width z. Here, a lower limit of the untuck width z is 0, and an upper limit of the untuck width z may be a width of the fifth edge gate electrode 530 in the third direction X2.

FIG. 18 is a graph illustrating a relation between the untuck width z and a saturation current (Idsat) in the NMOS.

In FIG. 18, as the untuck width z increases, the saturation current (Idsat) tends to decrease. That is, as the width z in the third direction X2 in which the fifth edge gate electrode 530 does not overlap the fifth fin pattern 510 increases, the saturation current (Idsat) of the transistor including the fifth fin pattern 510 tends to decrease.

In another words, as the width L1 in the third direction X2 in which the fifth edge gate electrode 530 extends along the upper surface of the fifth fin pattern 510 increases, the saturation current (Idsat) of the transistor including the fifth fin pattern 510 may increase.

For example, the width L1 in the third direction X2 in which the fifth edge gate electrode 530 extends along the upper surface of the fifth fin pattern 510 may be less than the width L2 in the fifth direction X3 in which the seventh edge gate electrode 730 extends along the upper surface of the seventh fin pattern 710.

At this time, the saturation current of the transistor including the fifth fin pattern 510 may be less than the saturation current of the transistor including the seventh fin pattern 710.

The distance between the fifth and sixth gate electrodes 530, 530_1, 630 and 630_1 may be a first pitch P1. The distance between the seventh and eighth gate electrodes 730, 730_1, 830 and 830_1 may be a second pitch P2.

When the first pitch P1 and the second pitch P2 are the same, the width of the third fin-cut trench 108t in the third direction X2 may be greater than the width of the fourth fin-cut trench 109t in the fifth direction X3.

If the first pitch P1 and the second pitch P2 are different from each other, the width of the third fin-cut trench 108t in the third direction X2 may be greater than, equal to or less than the width of the fourth fin-cut trench 109t in the fifth direction X3.

Figure 19:
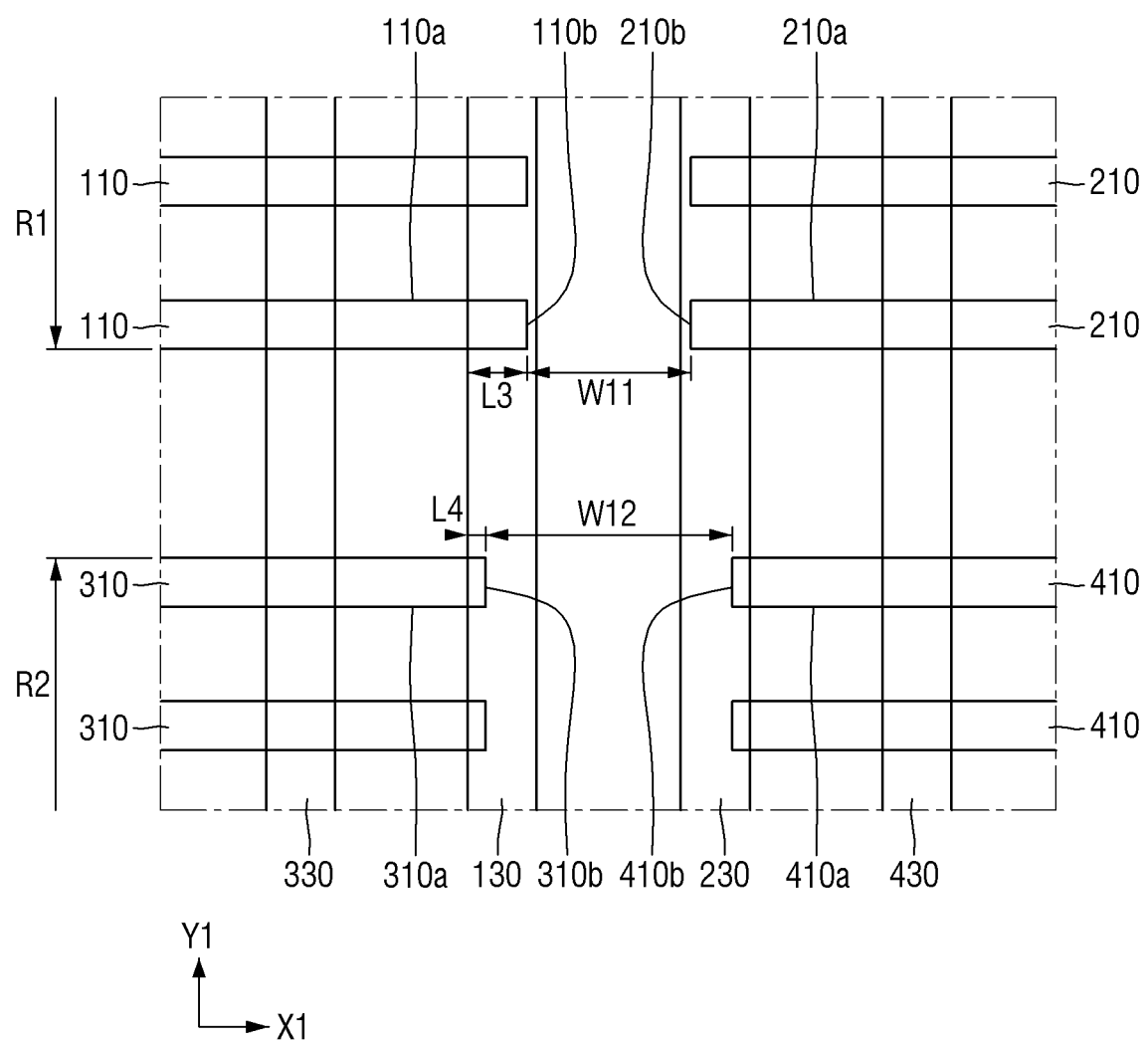
FIG. 19 is a schematic layout diagram illustrating the semiconductor device according to some embodiments of the present disclosure.

FIG. 19 is a schematic layout diagram illustrating a semiconductor device according to some embodiments of the present disclosure. For the sake of convenience of explanation, differences from those described with reference to FIG. 1 to FIG. 4 will be mainly described.

Referring to FIG. 19, in the semiconductor device according to some embodiments of the present disclosure, the width in the first direction X1 in which the first gate electrode 130 extends along the upper surface of the first fin pattern 110 may be a third length L3. The width in the first direction X1 in which the first gate electrode 130 extends along the upper surface of the third fin pattern 310 may be a fourth length L4.

For example, the third length L3 is greater than the fourth length L4.

The width L3 in the first direction X1 in which the first gate electrode 130 extends along the upper surface of the first fin pattern 110 is less than the width (W31 of FIG. 2) of the first gate electrode 130 in the first direction X1. The width L4 in the first direction X1 in which the first gate electrode 130 extends along the upper surface of the third fin pattern 310 is less than the width (W31 of FIG. 2) of the first gate electrode 130 in the first direction X1.

Figure 20:
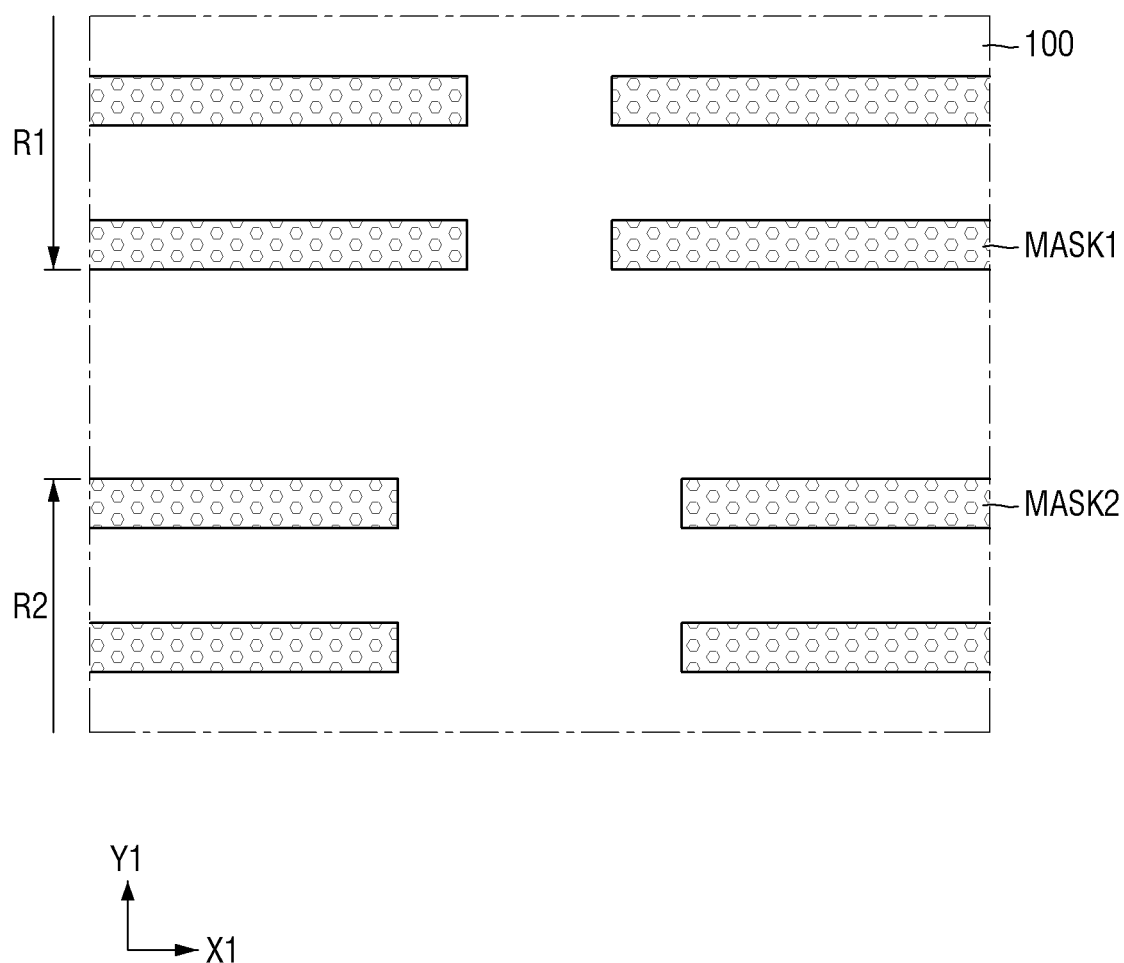
FIG. 20 to FIG. 22 are intermediate step diagrams illustrating the manufacturing method of the semiconductor device according to some embodiments of the present disclosure.
Figure 21:
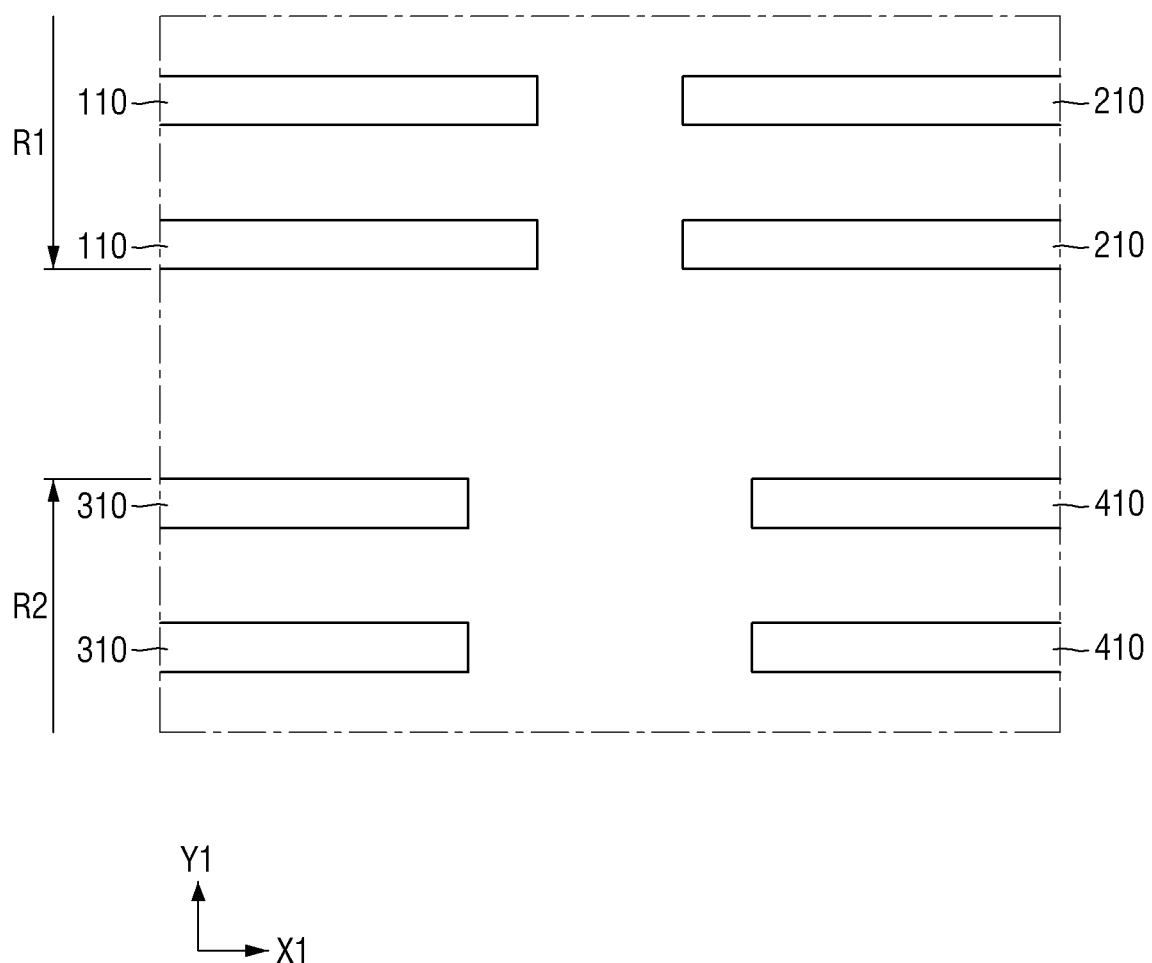
Figure 22:
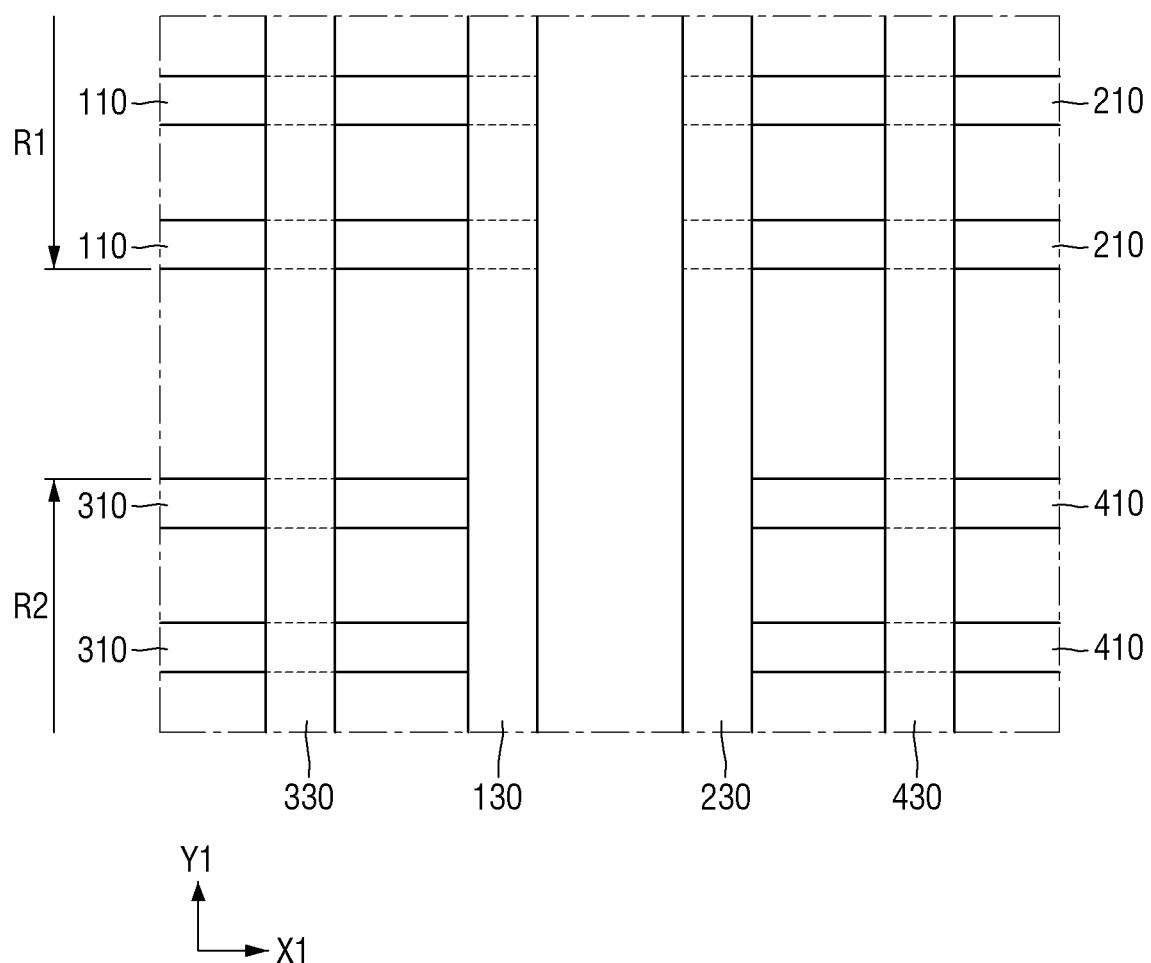

FIG. 20 to FIG. 22 are intermediate step diagrams illustrating a method of manufacturing the semiconductor device according to some embodiments of the present disclosure.

Referring to FIG. 20, a first mask pattern MASK1 and a second mask pattern MASK2 may be formed on the substrate 100.

The first mask pattern MASK1 may be formed in the first region R1 and the second mask pattern MASK2 may be formed in the second region R2.

Referring to FIG. 21, first to fourth fin patterns 110, 210, 310 and 410 may be formed, using the first mask pattern MASK1 and the second mask pattern MASK2.

Each of the first to fourth fin patterns 110, 210, 310 and 410 may extend long in the first direction X1. The first fin pattern 110 and the third fin pattern 310 may be spaced apart from each other in the second direction Y1. The second fin pattern 210 and the fourth fin pattern 410 may be spaced part from each other in the second direction Y1.

Referring to FIG. 22, first to fourth gate electrodes 130, 230, 330 and 430 extending long in the second direction Y1 may be formed.

The first gate electrode 130 is disposed on the first fin pattern 110 and may overlap the terminal end of the first fin pattern 110. The second gate electrode 230 is disposed on the second fin pattern 210 and may overlap the terminal end of the second fin pattern 210.

The third gate electrode 330 may be formed on the first fin pattern 110 and the third fin pattern 310. The third gate electrode 330 may intersect the first fin pattern 110 and the third fin pattern 310. The fourth gate electrode 430 may be formed on the second fin pattern 210 and the fourth fin pattern 410. The fourth gate electrode 430 may intersect the second fin pattern 210 and the fourth fin pattern 410.

Figure 23:
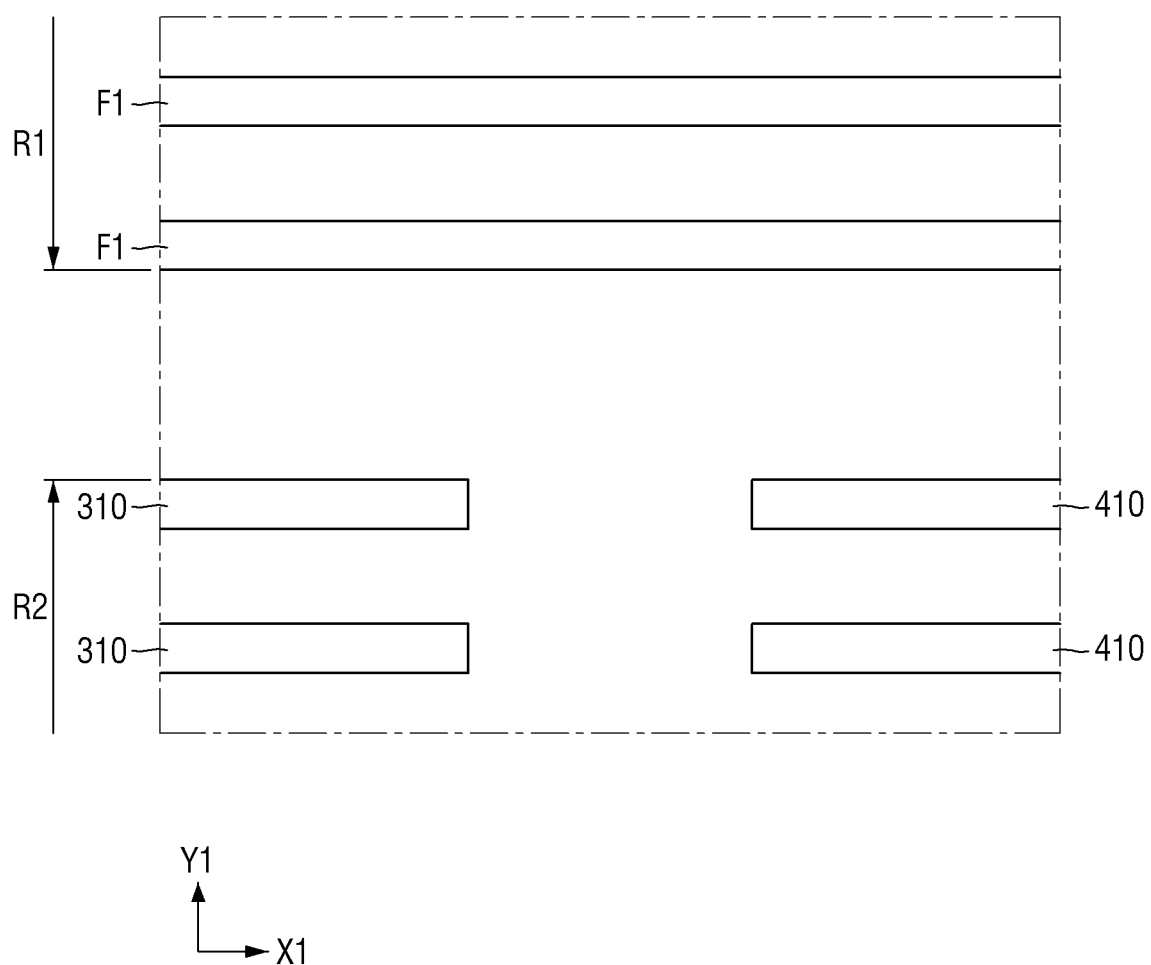
FIG. 23 to FIG. 25 are intermediate step diagrams illustrating the manufacturing method of the semiconductor device according to some embodiments of the present disclosure.
Figure 24:
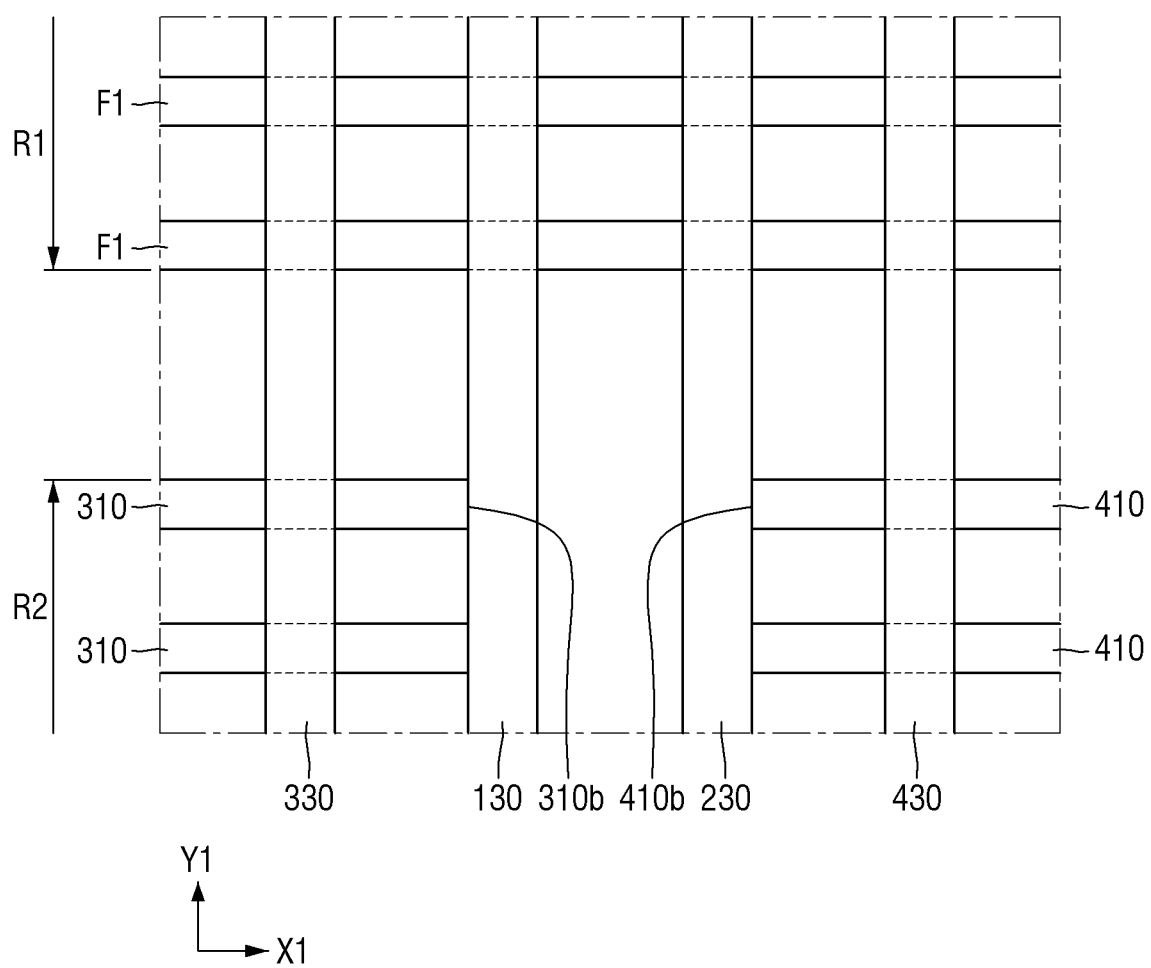
Figure 25:
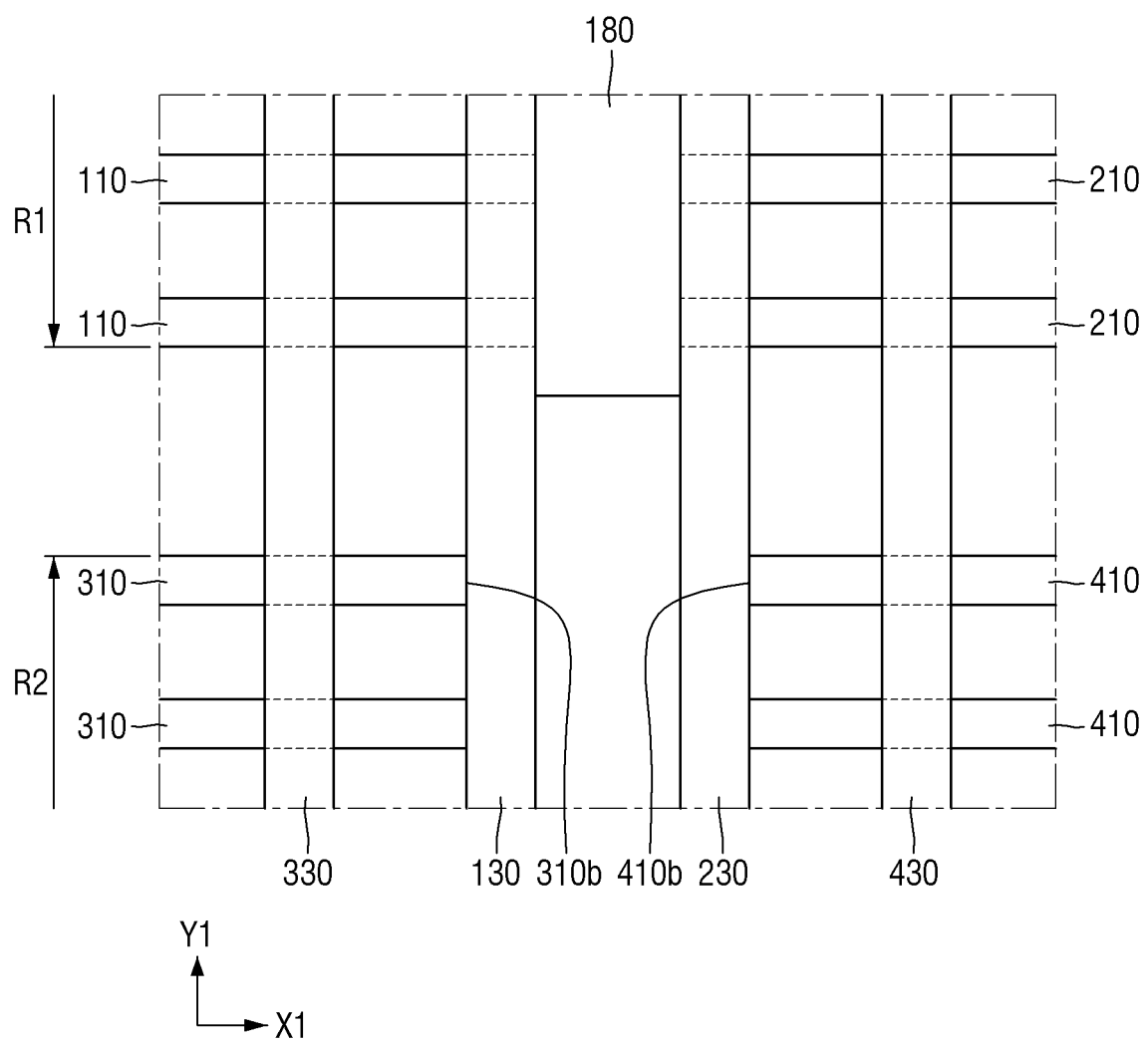

FIG. 23 to FIG. 25 are intermediate step diagrams illustrating the method of manufacturing the semiconductor device according to some embodiments of the present disclosure.

Referring to FIG. 23, free fins F1 extending long in the first direction X1 are formed in the first region R1. The free fins F1 are spaced apart from each other in the second direction Y1.

A third fin pattern 310 and a fourth fin pattern 410 aligned in the first direction X1 are formed in the second region R2. The third fin pattern 310 and the fourth fin pattern 410 are spaced apart from each other in the first direction X1.

The free fin F1 is spaced apart from the third fin pattern 310 and the third fin pattern 310 in the second direction Y1.

Referring to FIG. 24, first to fourth gate electrodes 130, 230, 330 and 430 extending long in the second direction Y1 may be formed.

The first gate electrode 130 and the second gate electrode 230 may be disposed on the free fins F1. The first gate electrode 130 and the second gate electrode 230 are disposed between the shorter side 310b of the third fin pattern and the shorter side 410b of the fourth fin pattern.

The third gate electrode 330 may be formed on the free fin F1 and the third fin pattern 310. The third gate electrode 330 may intersect the free fin F1 and the third fin pattern 310.

The fourth gate electrode 430 may be formed on the free fin F1 and the fourth fin pattern 410. The fourth gate electrode 430 may intersect the free fin F1 and the fourth fin pattern 410.

Referring to FIG. 25, the free fin F1 between the first gate electrode 130 and the second gate electrode 230 may be removed. As a result, the first fin pattern 110 and the second fin pattern 210 may be formed.

The space from which the free fin F1 is removed is filled with an insulating material, and the isolation structure 180 may be formed.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate comprising a first fin pattern and a second fin pattern in a NMOS region of the substrate, each extending lengthwise along a first direction and separated by a first trench, and a third fin pattern and a fourth fin pattern in a PMOS region of the substrate, each extending lengthwise along the first direction in parallel with respective ones of the first fin pattern and the second fin pattern and separated by a second trench;
   a first isolation layer in the first trench;
   a second isolation layer in the second trench;
   a first gate electrode extending lengthwise along a second direction transverse to the first direction and crossing the first fin pattern;
   a second gate electrode extending lengthwise along the second direction and crossing the second fin pattern;
   a third gate electrode extending lengthwise along the second direction on the second isolation layer; and
   a fourth gate electrode extending lengthwise along the second direction on the second isolation layer and spaced apart from the third gate electrode.

2. The semiconductor device of claim 1, wherein the third gate electrode and the fourth gate electrode are not disposed on upper surfaces of the third fin pattern and the fourth fin pattern.

3. The semiconductor device of claim 1, further comprising:
   a first gate spacer on a sidewall of the third gate electrode and in contact with the third fin pattern; and
   a second gate spacer on a sidewall of the fourth gate electrode and in contact with the fourth fin pattern.

4. The semiconductor device of claim 3, wherein at least a part of the first gate spacer is disposed on an upper surface of the third fin pattern, and wherein at least a part of the second gate spacer is disposed on an upper surface of the fourth fin pattern.

5. The semiconductor device of claim 1, further comprising:
   a first gate spacer on a sidewall of the first gate electrode and not overlapping the first isolation layer; and
   a second gate spacer on a sidewall of the second gate electrode and not overlapping the first isolation layer.

6. The semiconductor device of claim 1, wherein an upper surface of the first isolation layer is higher than upper surfaces of the first fin pattern and the second fin pattern, and wherein an upper surface of the second isolation layer is lower than upper surfaces of the third fin pattern and the fourth fin pattern.

7. The semiconductor device of claim 6, wherein the upper surface of the first isolation layer is higher than or at the same level as an upper surface of the first gate electrode.

8. The semiconductor device of claim 1, wherein an upper surface of the first isolation layer is lower than upper surfaces of the first fin pattern and the second fin pattern, and wherein an upper surface of the second isolation layer is lower than upper surfaces of the third fin pattern and the fourth fin pattern.

9. The semiconductor device of claim 1, wherein a width of the first trench is less than a width of the second trench.

10. The semiconductor device of claim 1, wherein the first gate electrode is directly connected to the third gate electrode, and wherein the second gate electrode is directly connected to the fourth gate electrode.

11. A semiconductor device comprising:
    a substrate comprising a first fin pattern and a second fin pattern in a NMOS region of the substrate, each extending lengthwise along a first direction and separated by a first trench having a first width and a third fin pattern and a fourth fin pattern in a PMOS region of the substrate, each extending lengthwise along the first direction in parallel with respective ones of the first fin pattern and the second fin pattern and separated by a second trench having a second width greater than the first width;
    a first gate electrode crossing the first fin pattern;
    a second gate electrode crossing the second fin pattern and spaced apart from the first gate electrode by a first distance greater than or equal to the first width; and
    a third gate electrode and a fourth gate electrode between the third fin pattern and the fourth fin pattern.

12. The semiconductor device of claim 11, wherein the third gate electrode wraps around an end of the third fin pattern and wherein the fourth gate electrode wraps around an end of the fourth fin pattern.

13. The semiconductor device of claim 11, further comprising:
    a first gate spacer on a sidewall of the first gate electrode; and a second gate spacer on a sidewall of the second gate electrode,
wherein the first and second gate spacers are separated by a distance equal to the first width.

14. The semiconductor device of claim 13, further comprising an isolation layer in the first trench and between the first and second spacers.

15. The semiconductor device of claim 11, further comprising:
a first isolation layer in the first trench; and
a second isolation layer in the second trench.

16. A semiconductor device comprising:
a substrate comprising a first fin pattern and a second fin pattern in a NMOS region of the substrate, each extending lengthwise along a first direction and separated by a first trench and a third fin pattern and a fourth fin pattern in a PMOS region of the substrate, each extending lengthwise along the first direction in parallel with respective ones of the first fin pattern and the second fin pattern and separated by a second trench;
a first isolation layer in the first trench;
a second isolation layer in the second trench;
a first gate electrode extending lengthwise along a second direction transverse to the first direction and crossing the first fin pattern; and
a second gate electrode extending lengthwise along the second direction and crossing the second fin pattern,
wherein the first gate electrode and the second gate electrode are disposed between the third fin pattern and the fourth fin pattern and do not overlap the first trench.

17. The semiconductor device of claim 16, wherein each of the first gate electrode and the second gate electrode do not cross the third fin pattern and the fourth fin pattern.

18. The semiconductor device of claim 16, wherein an upper surface of the first isolation layer is lower than upper surfaces of the first fin pattern and the second fin pattern.

19. The semiconductor device of claim 16, wherein an upper surface of the first isolation layer is higher than an upper surface of the first gate electrode.

20. The semiconductor device of claim 19, wherein the first isolation layer extends between the third fin pattern and the fourth fin pattern.

* * * * *